United States Patent [19]
Idei et al.

[11] Patent Number: 5,955,905
[45] Date of Patent: Sep. 21, 1999

[54] SIGNAL GENERATOR WITH SYNCHRONOUS MIRROR DELAY CIRCUIT

[75] Inventors: Youji Idei, Asaka; Masakazu Aoki, Tokorozawa; Hiromasa Noda, Tokyo, all of Japan

[73] Assignee: Hitachi, Ltd., Tokyo, Japan

[21] Appl. No.: 08/967,612

[22] Filed: Nov. 10, 1997

[30] Foreign Application Priority Data

Nov. 11, 1996 [JP] Japan .................................... 8-314225

[51] Int. Cl.$^6$ ..................................................... H03L 7/00
[52] U.S. Cl. ............................................ 327/160; 327/163
[58] Field of Search ..................................... 327/141, 142, 327/144, 151, 153, 160, 161, 162, 163

[56] References Cited

U.S. PATENT DOCUMENTS

| | | | |
|---|---|---|---|
| 4,524,448 | 6/1985 | Hullwegen | 375/118 |
| 4,538,119 | 8/1985 | Ashida | 331/1 A |
| 5,245,637 | 9/1993 | Gersbach et al. | 375/119 |
| 5,500,627 | 3/1996 | Hulsing, II | 331/1 A |
| 5,506,878 | 4/1996 | Chiang | 377/39 |
| 5,554,946 | 9/1996 | Curran et al. | 327/172 |

FOREIGN PATENT DOCUMENTS 8-237091  9/1996  Japan .

OTHER PUBLICATIONS

T. Saeki et al., "SP 23.4: A 2.5ns Clock Access 250MHz 256Mb SDRAM with a Synchronous Mirror Delay", 1996 IEEE Int'l. Solid–State Circuits Conference, Session 23/DRAM/Paper SP23.4.

*Primary Examiner*—Kenneth B. Wells
*Assistant Examiner*—Hai L. Nguyen
*Attorney, Agent, or Firm*—Antonelli, Terry, Stout & Kraus, LLP

[57] ABSTRACT

A clock signal received from an external terminal through an input buffer is delayed by delay circuits. A counter circuit is started up in accordance with the clock signal transmitted through the delay circuits to count an oscillation pulse having a frequency which is sufficiently high with respect to that of the clock signal. Further, the counter circuit reversely counts the count in response to a clock signal delayed by one cycle, which has passed through the input buffer. When its count once again reaches the counter value at the start of counting, the counter circuit generates an output timing signal and transmits it to an internal circuit through a clock driver. A delay time outputted from the delay circuits is set to a delay time corresponding to the sum of a delay time of the input buffer and a delay time of the clock driver.

16 Claims, 18 Drawing Sheets

DCLK : COUNTING CLOCK FOR DOWN COUNTER
UCLK : COUNTING CLOCK FOR UP COUNTER

SIGNAL GENERATOR WITH SYNCHRONOUS MIRROR DELAY CIRCUIT

BACKGROUND OF THE INVENTION

This invention relates to a semiconductor integrated circuit device, and to a technique effective for use in semiconductor integrated circuit devices of the type activated in synchronism with a clock signal, such as a synchronous dynamic RAM (Random Access Memory) having a synchronous clock generator, a one-chip microcomputer provided with a synchronous clock generator for generating an internal clock obtained by frequency-multiplying an external clock, etc.

A synchronous mirror delay circuit (SMD) is a circuit for synchronizing an external clock and an internal clock with each other. This type of synchronous mirror delay circuit has been disclosed in the ISSCC DIGEST OF TECHNICAL PAPERS, p.p. 374-375, Feb. 10, 1996 and Japanese Patent Laid-Open No. 8-237091.

SUMMARY OF THE INVENTION

FIG. 18 is a circuit diagram showing a synchronous mirror delay circuit previously discussed by the inventors of the present application. FIG. 19 is a waveform chart for describing the operation of the synchronous mirror delay circuit. We will consider a case where the rising edge of an internal clock CLKout is synchronized with the rise of an external clock signal CLKin in this circuit. The external clock signal CLKin is inputted to a forward delay array circuit (hereinafter called "FDA") through three delay circuits whose delay times are defined as d1, d2 and d3, respectively. The leading edge of a clock signal corresponding to an nth cycle, which is being propagated through the FDA, is prevented from propagating through the FDA due to the rise of a clock signal corresponding to an n+1th cycle, which is propagated as a common signal COMMON. Simultaneously, the leading edge thereof is transferred to each node in a backward delay array (hereinafter called "BDA") located at a position symmetric with respect to a position where its propagation is stopped.

The leading edge referred to above is propagated through the BDA over just the same time as a the propagation time tDA in the FDA and is outputted as an internal clock signal CLKout through a delay circuit (corresponding to an internal clock driver) having a delay time d2. Since the propagation of the leading edge of the clock signal corresponding to the nth cycle in the FDA is stopped by the leading edge of the COMMON signal corresponding to the n+1th cycle, the relationship in the following equation (1) is established. In the equation (1), tCK indicates a cycle time (one period or cycle) of the clock signal CLKin.

$$d2+d1+tDA=tCK \quad (1)$$

If the time required for the external clock signal CLKin to propagate from the leading edge of the external clock signal CLKin to the leading edge of the internal clock signal CLKout is calculated along the above-described propagation path, then the relationship in the following equation (2) is established. Namely, the time from the external clock signal CLKin to the internal clock signal CLKout becomes equal to 2tCK and the external clock signal CLKin is synchronized with the internal clock signal CLKout.

$$d1+d2+d1+tDA+tDA+d2=2(d1+d2+tDA)=2tCK \quad (2)$$

It became evident from the consideration given by the present inventors that, the above-described synchronous circuit has a problem in that in order to increase its operating frequency range, the number of logic stages constituting the FDA, MCC and BDA becomes massive and its circuit scale increases. For example, a synchronous DRAM has a tendency to cause an increase in its operating frequency with the speeding up of a memory access operation. On the other hand, it is a convenience to perform refresh or the like with lowered frequencies of clock signals for purposes of less power consumption, and hence this difference tends to increase more and more. Further, an increase in the frequency range of the clock signal is required so that the synchronous DRAM can be used as a general purpose memory. When one attempts to increase the frequency range of each of the clock signals to be synchronized in this way, a contradictory problem will arise in that the number of delay stages that constitute the FDA, MCC and BDA, becomes massive to match the frequency range, thereby causing an increase in circuit scale, and the current to be used up by the synchronous clock generator increases, even though the frequency of each clock signal has been lowered for purposes of reducing the power consumption, as in the case of, for example, a refresh operation or the like.

When a PLL circuit or a DLL circuit is used, a considerable time is required to bring it into a phased-locked state, so that its responsiveness presents a large problem. Further, a further problem arises in that the circuit is affected by relatively large noise produced in a power source line in a digital circuit to thereby make its operation unstable. This, will lead to the development of a synchronous clock generator using a digital circuit.

An object of the present invention is to provide a semiconductor integrated circuit device which is equipped with a synchronous clock generator wherein a synchronizable clock frequency band is enlarged using a simple configuration. Another object of the present invention is to provide a semiconductor integrated circuit device provided with a synchronous clock generator which is capable of forming a clock signal that is frequency-multiplied using a simple configuration and within a short time. The above and other objects and novel features of the present invention will become more apparent from the description provided in the present specification and from the accompanying drawings.

A summary of a typical one of the features disclosed in the present application will be described in brief as follows: A clock signal received via an external terminal through an input buffer is delayed by delay circuits. A counter circuit is started up in accordance with the clock signal transmitted through the delay circuits to count an oscillation pulse which is set sufficiently high with respect to the clock signal. Further, the counter circuit reversely counts the above count in response to a clock signal delayed by one cycle and which has passed through the input buffer. When the resultant count is restored to the count at the start of counting, the counter circuit generates an output timing signal and transmits it to an internal circuit through a clock driver. A delay time of the delay circuits is set to a delay time corresponding to the sum of a delay time of the input buffer and a delay time of the clock driver.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
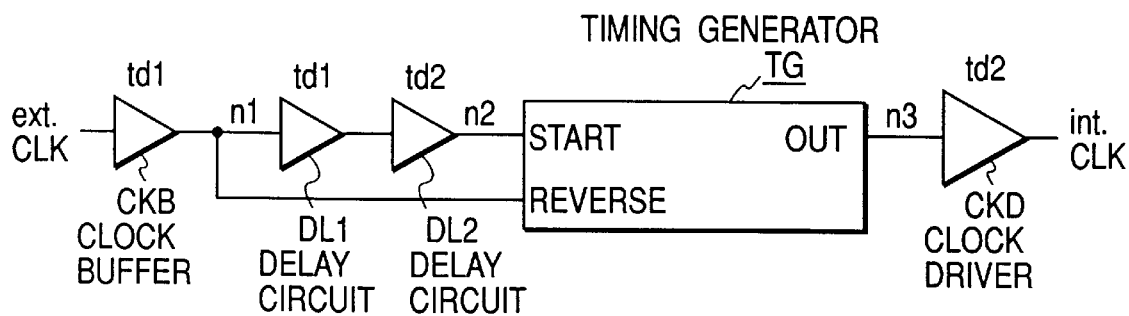
FIG. 1 is a block diagram for describing the basic concept of a synchronous clock generator according to the present invention.

FIG. 1 is a block diagram for describing the basic concept of a synchronous clock generator according to the present invention. Although the invention is not restricted to the particular example, the synchronous clock generator is formed on a single semiconductor substrate, such as a monocrystal silicon substrate made by known semiconductor integrated circuit manufacturing techniques together with other circuits constituting a synchronous DRAM.

A clock buffer CKB serves as an input buffer circuit and is provided to take in or capture an external clock signal ext.CLK supplied from an external terminal. On the one hand, a signal outputted from the clock buffer CKB is transmitted to a start terminal (START) of a timing generator TG through delay circuits DL1 and DL2. On the other hand, the signal outputted from the clock buffer CKB is also transmitted to a reverse terminal (REVERSE) of the timing generator TG. The timing generator TG comprises a counter circuit to reduce its circuit scale, which triggers a counting operation in response to a first input signal supplied to the start terminal (START) so as to start counting in one direction (e.g., perform up counting, i.e., count up) and reverses the counting operation (e.g., performs down counting, i.e., count down) in response to a second input signal supplied to the reverse terminal (REVERSE), in other words, performs the same down count as the up count after the elapse of a time interval corresponding to the difference in time between the first and second input signals to thereby output a timing signal from an output terminal OUT.

A pulse used for the counting operation is formed or produced by an internally-provided oscillator. The oscillation frequency of the oscillator is set to a frequency sufficiently higher than that of the clock signal CLK. The timing signal generated from the timing generator TG is used to produce an internal clock int.CLK through a clock driver CKD.

Figure 2:
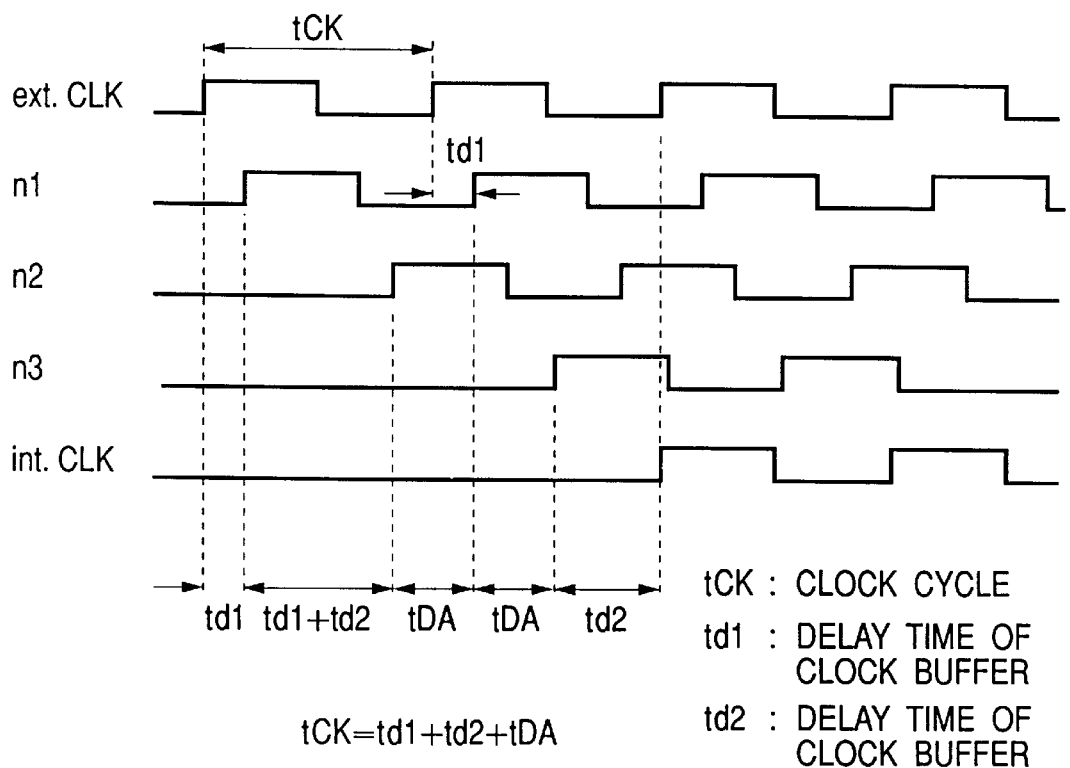
FIG. 2 is a timing chart for describing the operation of the synchronous clock generator shown in FIG. 1.

FIG. 2 is a timing chart for describing the operation of the synchronous clock generator shown in FIG. 1. One period or cycle of the external clock signal ext.CLK is represented as tCK. The signal at an output node n1 of the clock buffer CKB is set as a clock signal delayed by a delay time td1 from tCK. The signal at the output node n1 of the clock buffer CKB is delayed by the delay time td1 and a delay time td2 by the delay circuits DL1 and DL2, respectively, followed by transfer to the start terminal of the timing generator TG. On the other hand, the signal at the output node n1 of the clock buffer CKB is also transmitted to the reverse terminal of the timing generator TG as it is.

After a delay time td1+td1+td2 has elapsed from the leading edge of the external clock signal ext.CLK, the start terminal of the timing generator TG is supplied with an input signal (node n2) to start counting. After the delay time td1 has elapsed from the external clock signal delayed by one cycle (tCK), the reverse terminal thereof is supplied with the input signal (node n2) to reverse counting. As a result, one cycle tCK of the clock signal at the node n1 is represented as the following equation (1):

$$tCK=td1+td2+tDA \qquad (3)$$

The timing generator TG performs its counting operation by the same time tDA as a count corresponding to the time difference tDA to produce a timing signal (node n3), thereby causing the internal clock signal int.CLK having the delay time td2 of the clock driver CKD to rise. Namely, the time spent from the leading edge of the external clock signal ext.CLK to the leading edge of the internal clock signal int.CLK results in td1+td1+td2+tDA+tDA+td2=2(td1+td2+tDA). Since this time td1+td2+tDA is equal to one cycle tCK of the clock signal as expressed in the above equation (3), the internal clock signal int.CLK is synchronized with every alternate external clock signal ext.CLK.

Figure 3:
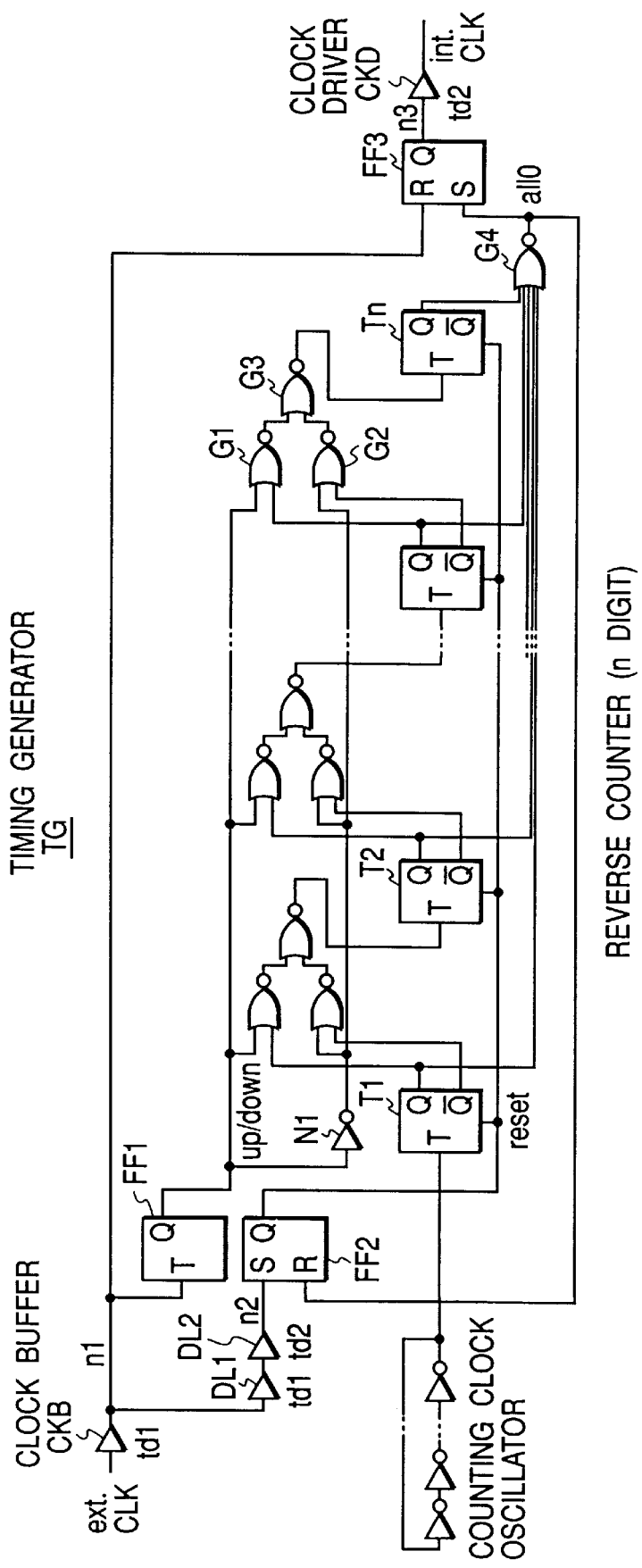
FIG. 3 is a logic circuit diagram showing one embodiment of a synchronous pulse generator according to the present invention.

FIG. 3 is a logic circuit diagram showing one embodiment of a synchronous pulse generator according to the present invention. In the present embodiment, a timing generator TG comprises a reverse counter. Namely, an n-digit up/down reverse counter is constructed in such a manner that non-reverse outputs Q and reverse signals /Q of T-type flip-flop circuits T through Tn are successively transferred to the following-stage circuits by being switched by an up/down control signal up/down. The switching circuits are respectively provided so as to correspond to outputs of respective digits. As is shown as an illustrative example in the final-stage T-type flip-flop circuit Tn, each switching circuit is composed of n-1 unit circuits wherein a NOR gate circuit G1 supplied with the up/down control signal up/down and the non-reverse output Q, a NOR gate circuit G2 supplied with a signal obtained by inverting the up/down control signal up/down with an inverter N1 and the non-reverse output /Q and a NOR gate circuit G3 for producing an output signal in response to the outputs of the two NOR gate circuits G1 and G2 are defined as a unit circuit.

The non-reverse outputs Q produced from the respective stages of the T-type flip-flop circuits T1 through Tn that constitutes the counter circuit, are respectively inputted to a NOR gate G4 for forming or producing a detected signal a110. Namely, the a110 type detection circuit is used to detect that the count of the counter is zero. The detected signal a110 is used as a set signal S for a flip-flop circuit FF3.

Flip-flop circuits FF1 and FF2 are provided to control the up/down operation of the reverse counter. In the flip-flop circuit FF1, a signal (node n1) outputted from a clock buffer CKB is supplied to a trigger terminal T and hence an output Q is inverted in synchronism with the leading edge of the signal to produce the up/down control signal up/down. The flip-flop circuit FF2 is set by a delay signal (node n2) transmitted through the delay circuits DD1 and DD2 and is reset by the detected signal a110. A non-reverse output Q of the flip-flop circuit FF2 is used as a reset signal for the T-type flip-flop circuits T1 through Tn that constitutes the counter circuit.

Figure 18:
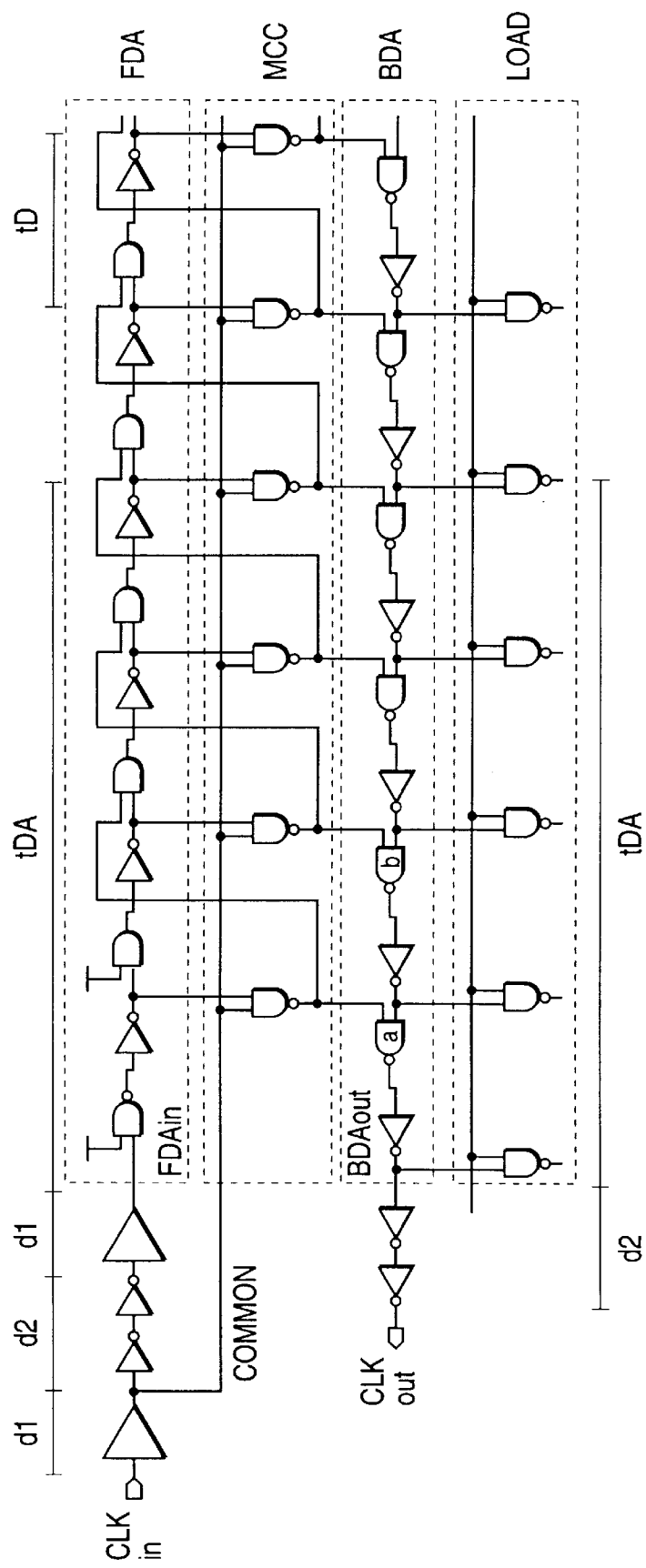
FIG. 18 is a partial circuit diagram of a synchronous mirror delay circuit considered by the present inventors prior to the invention of the present application.
Figure 19:
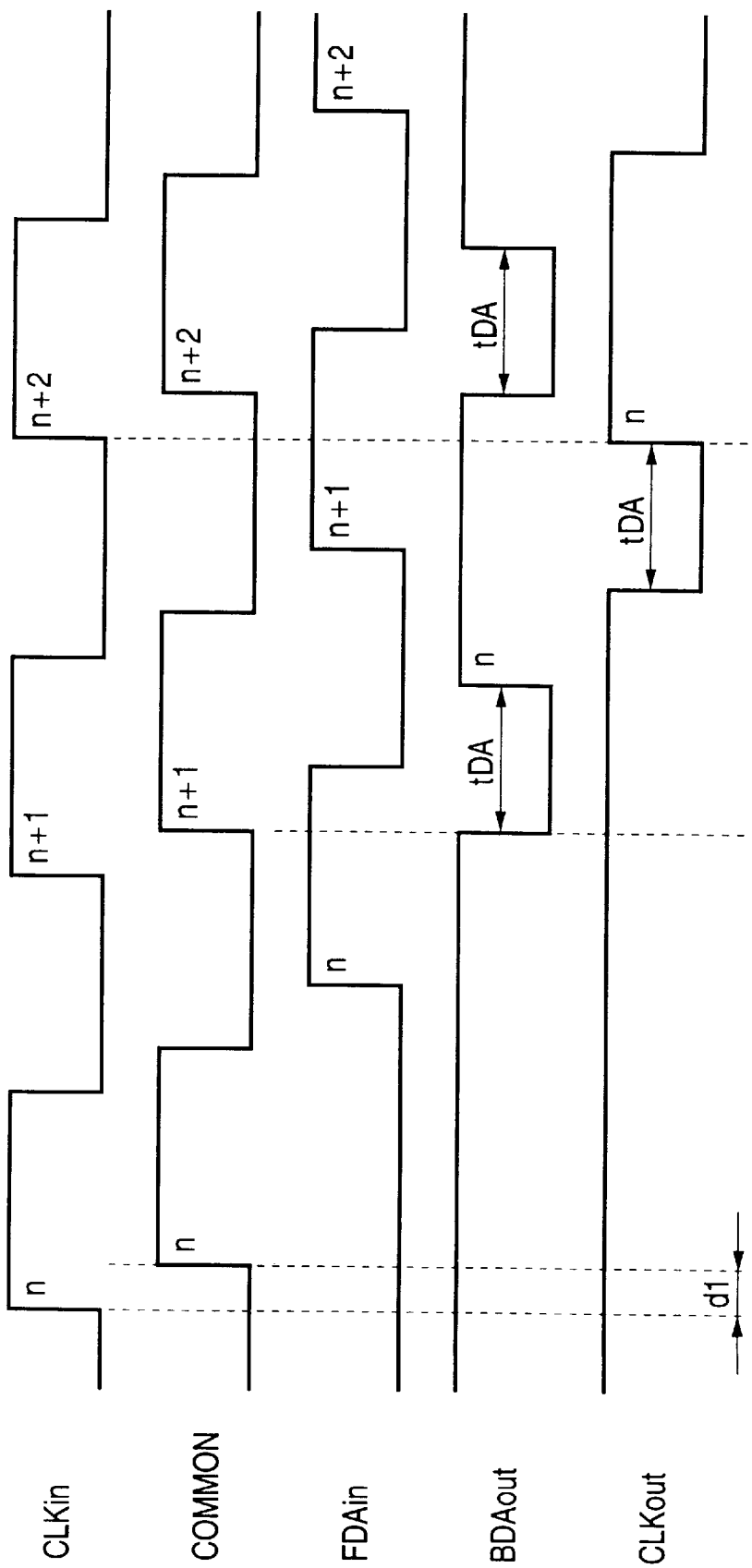
FIG. 19 is a timing chart for describing the operation of the circuit shown in FIG. 18.

A counting clock oscillator is composed of a series of odd-numbered inverters connected to each other in a ring-like arrangement. An oscillation pulse produced from the counting clock oscillator is set to a frequency sufficiently higher than that of the external clock signal ext.CLK and is supplied to a trigger terminal T of the initial-stage T-type flip-flop circuit T1 that constitutes the counter circuit. When such a counter circuit is used, count outputs of 1024 can be obtained by a 10-stage binary counter, for example. Namely, the synchronous pulse generator shown in FIG. 18 using FDA, MCC and BDA is equivalent to a 1024-stage circuit and, hence, can be greatly reduced in circuit scale.

Figure 4:
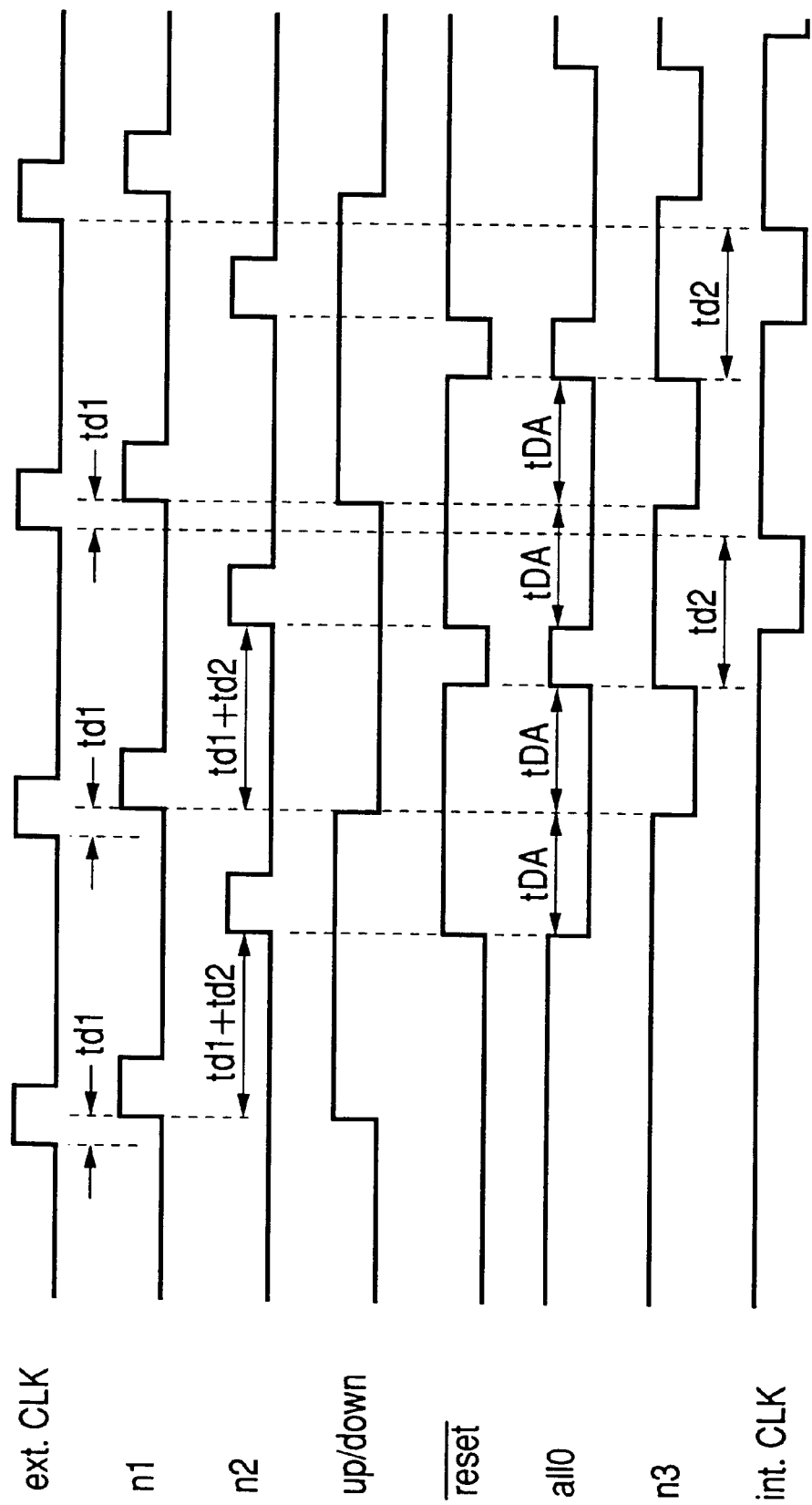
FIG. 4 is a timing chart for describing the operation of the synchronous pulse generator shown in FIG. 3.

FIG. 4 is a timing chart for describing the operation of the synchronous pulse generator. The output signal (node n1) goes high in level or rises to a high level after it is delayed by only a delay time td1 of the clock buffer CKB with respect to the leading edge of the initial external clock signal ext.CLK. Thus, the output of the flip-flop circuit FF1 changes from a low level to a high level so as to provide instructions for an up counting operation. At this time, the flip-flop circuit FF2 is in a reset state and thereby keeps the output Q low in level. Thus, the flip-flop circuit FF2 brings a reset signal/reset to a low level to thereby reset the T-type flip-flop circuits T1 through Tn that constitute the counter circuit. Therefore, the counting operation of the flip-flop circuit FF2 is forcedly brought to a halt or stop state. After the elapse of the delay times td1 and td2, the delay signal (node n2) transmitted through the delay circuits DL1 and DL2 rises to a high level so that the flip-flop circuit FF2 is set to bring the output Q thereof to a high level. Thus, the counter circuit starts counting the oscillation pulse because the reset signal/reset is rendered high in level.

After the delay time td1 has elapsed from the leading edge of the next external clock signal ext.CLK, the output signal (node n1) of the clock buffer CKB is rendered high in level so that the flip-flop circuit FF1 is reversed. Thus, the up/down control signal up/down is low in level so that switching to a down counting operation is done and the flip-flop circuit FF3 is reset. A down counting operation is done from an up count corresponding to the time difference tDA so that the count becomes 0 according to the down counting operation corresponding to the same time tDA. The detected signal a110 is brought to a high level in association with the count of 0 so that the flip-flop circuit FF3 is set to bring its output Q (node n3) to a high level. Thus, the internal clock signal int.CLK outputted from the clock driver CKD results in a signal accurately synchronized with the external clock signal ext.CLK inputted with a delay of two cycles (2 TCK).

Figure 5:
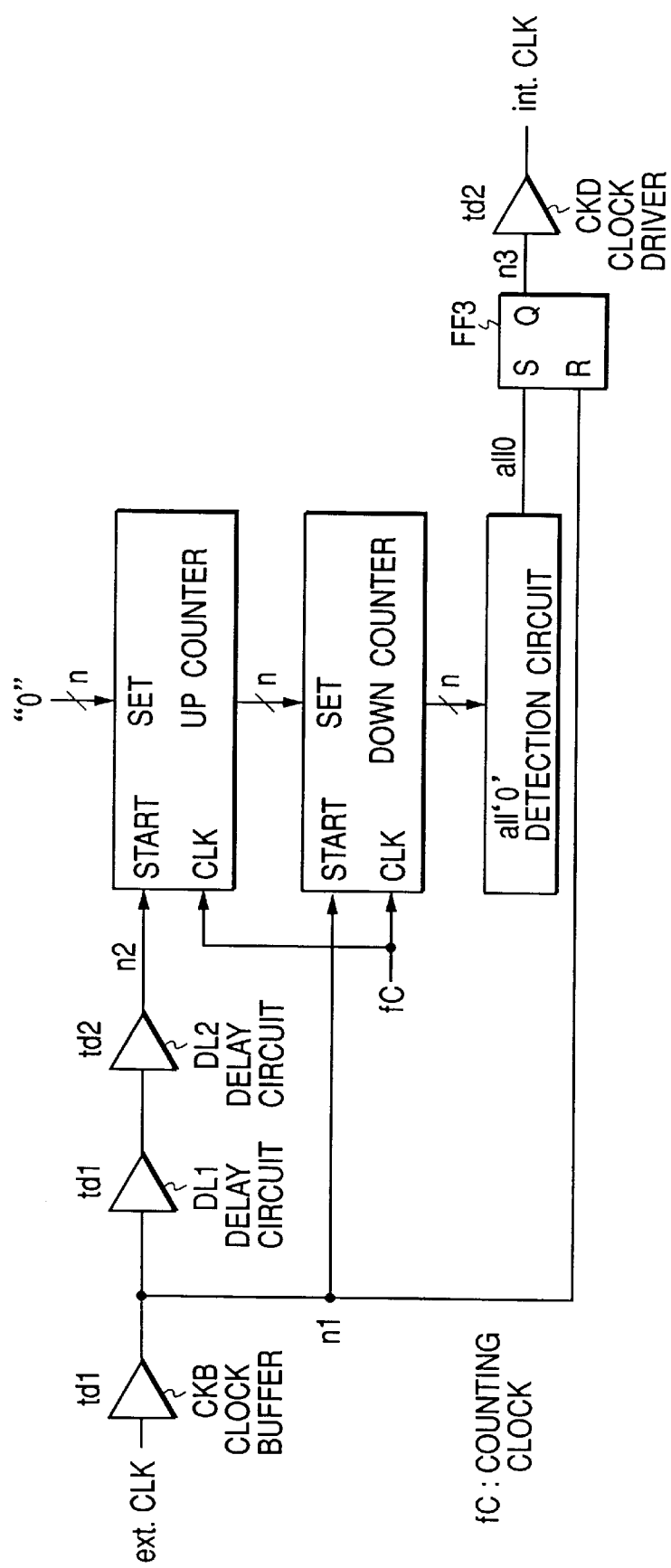
FIG. 5 is a schematic circuit diagram showing another embodiment of a synchronous pulse generator according to the present invention.

FIG. 5 is a block diagram showing another embodiment of a synchronous pulse generator according to the present invention. In the present embodiment, two counters corresponding to an up counter and a down counter are used as timing generators, each of which detects a time difference and generates a time interval equal to the time difference. Namely, the two counters are used in place of the up/down reverse counter employed in the embodiment shown in FIG. 3. The utilization of two counters permits an increase in circuit scale, but allows their operating ranges to be enlarged.

When an input signal is supplied to a start terminal of the up counter, the up counter captures a110 supplied to a set input terminal SET so as to start an up counting operation. When an input terminal is supplied to a start terminal of the down counter, the down counter takes in or captures a count output of the up counter, which is supplied to a set input SET, so as to start a down counting operation. The output of the down counter is inputted to an a110 detection circuit where a detected signal a110 similar to the above is produced.

In the present embodiment, the two counters corresponding to the up and down counters are required as described above and their circuit scale is substantially twice the previous one. However, since it is unnecessary to provide the gate circuits for performing the up/down switching, the flip-flop circuits FF1 and FF2 used for the operation control, etc. employed in the embodiment shown in FIG. 3, the circuit scale is not so increased and the delay times developed in the flip-flop circuits FF1 and FF2 or the like are not introduced in the present embodiment as errors, thus making it possible to provide high accuracy. Since the up counting operation and the down counting operation can be done simultaneously in parallel even if a clock signal having the next cycle transmitted through the delay circuits DL1 and DL2 are incoming during the down counting operation corresponding to the up count, the operating ranges of the counters can be enlarged.

Figure 6:
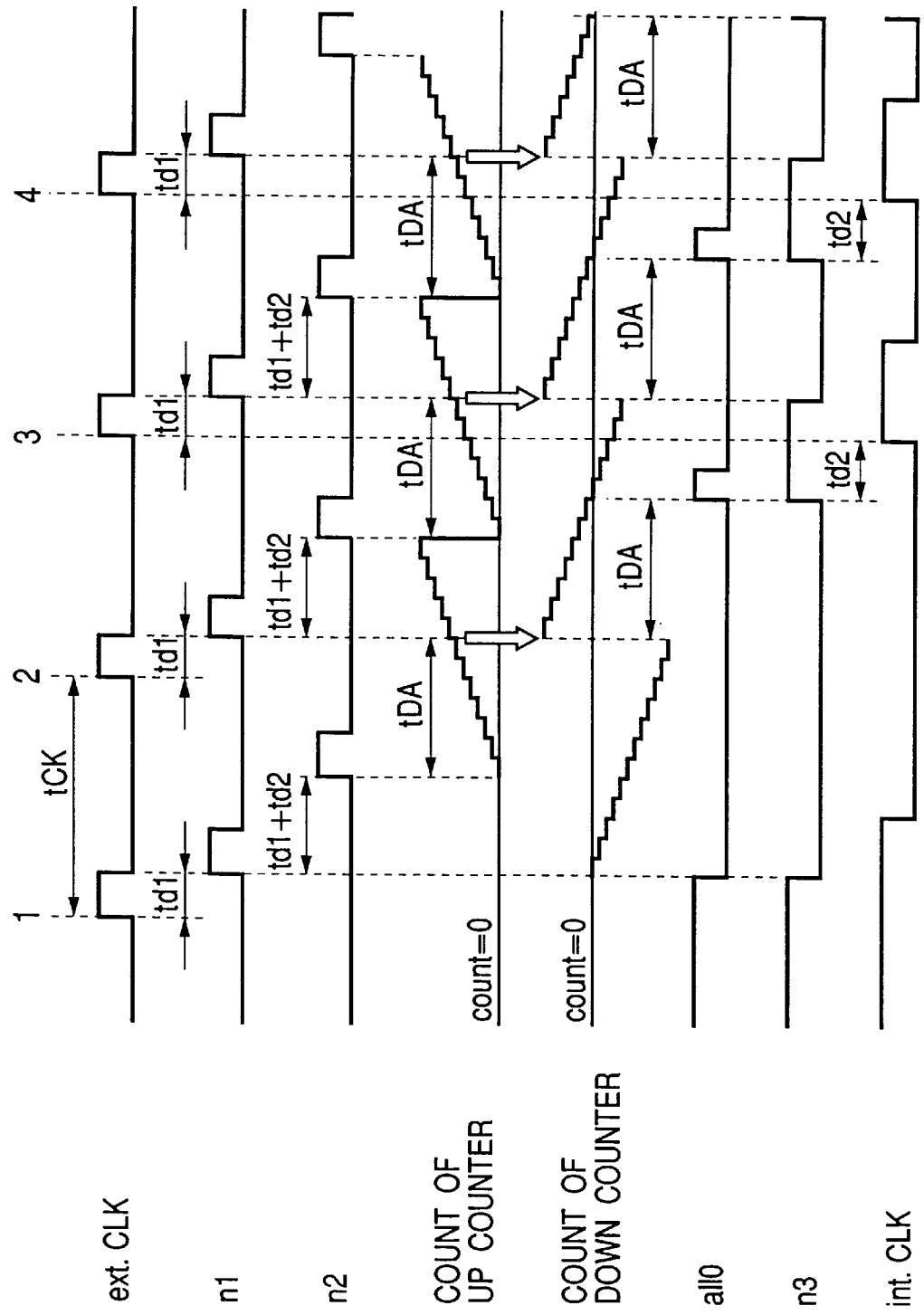
FIG. 6 is a timing chart for describing the operation of the synchronous pulse generator shown in FIG. 5.

FIG. 6 shows a timing chart for describing the operation of the synchronous pulse generator shown in FIG. 5. A first external clock signal ext.CLK is captured through a clock buffer CKB and a signal at a node n1 rises after the elapse of a delay time td1. As a result, the down counter starts counting but its counting, operation is not relevant. With the leading edge of the signal at the node n1, the flip-flip circuit FF3 is reset so that a node n3 is brought to a low level. A delay time td2 of a clock driver CKD elapses and an internal clock signal int.CLK is also rendered low in level.

After the elapse of the delay time td1+td2 developed through the delay circuits DL1 and DL2, the up counter supplied with a signal rendered high in level at a node n2 captures a110 as an initial value so as to start upcounting. In the drawing, each count is analogously represented in stepwise form to make the up counting easy. This is similar to the down count referred to above. The same counting clock signal fC is supplied to clock input terminals CLK of the up and down counters. The counting clock signal fC is produced by a ring oscillator as described above.

When a second external clock signal ext.CLK is inputted and a signal at the node n1 of the clock buffer CKB rises after the elapse of a delay time td1, the down counter captures the count of the up counter as an initial value so as to start downcounting. This down counting operation represents the original down counting operation for producing a time tDA corresponding to a time tDA created by the up counter. It should be noted in the present embodiment that when the delay time (td1+td2) corresponding to the output signal at the node n1, for providing instructions for the down counting operation of the second external clock signal ext.CLK, is rendered high in level in the course of the counting operation associated with the time tDA of the down counter, the up counter can take in or capture the initial value of a110 so as to perform the up counting operation. Namely, when the two up and down counters are provided as described above, they can perform synchronous pulse generating operations even under the above-described operating condition in response to it. Thus, the two counters can be enlarged in operating range.

When the down counter performs down counting concurrently with the operation of the up counter and its count reaches zero, the a110 detection circuit detects it and sets a flip-flop circuit FF3. Therefore, a signal at the output node n3 is changed to a high level so that an internal clock signal int.CLK outputted from the clock driver CKD rises to a high level with a delay of two cycles. This signal is defined as being synchronized with the leading edge of a third external clock signal ext.CLK.

Since the flip-flop circuit FF3 is reset by the high level at the node n1, as described above, the width of the pulse outputted from the flip-flop circuit FF3, in other words, the width of the output pulse of the internal clock signal int.CLK, is set so as to correspond to the delay time td2+td1 equal to the sum of td2 of the clock driver CKD an td1, of the clock buffer CKB.

Figure 7:
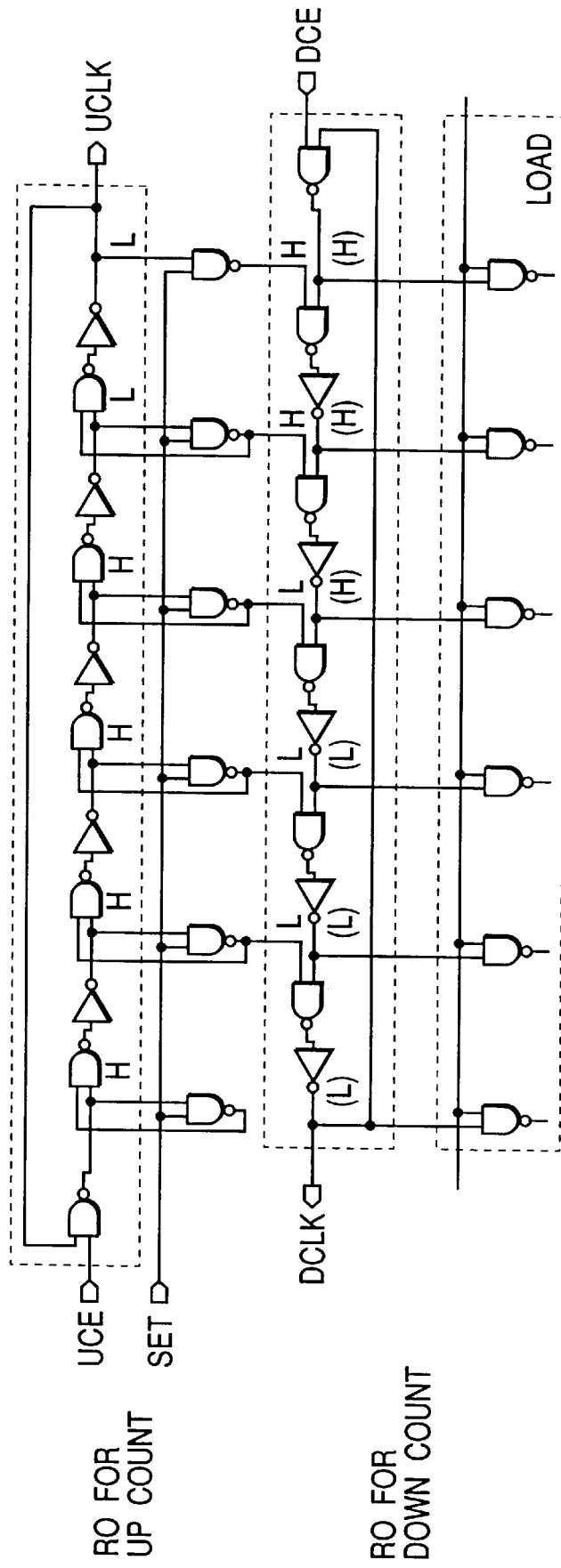
FIG. 7 is a schematic circuit diagram illustrating one example of a ring oscillator employed in a synchronous clock generator according to the present invention.

FIG. 7 is a circuit diagram showing one example of a ring oscillator employed in a synchronous clock generator according to the present invention. The ring oscillator is composed of a series of inverters of odd-numbered stages or the like. Since inverters which are cascade-connected in a three-stage form at minimum are generally unstable in operation, the ring oscillator is comprised of a relatively large number of logic stages from the viewpoint of stabilization of its oscillating operation. In the present embodiment, the ring oscillator comprises 11 stages made up of combinations of NAND gates and inverters.

Two ring oscillators for the up count and down count are used to enhance accuracy. In the two ring oscillators, the gates of the NAND gates are controlled by control signals UCE and DCE to allow the control of their oscillating operations. Namely, when the synchronous clock generator is put into a non-operating state, the signals UCE and DCE are rendered low in level and the output of each NAND gate is fixed to a high level to stop the oscillating operation without reference to an oscillation feedback signal, whereby less power consumption is achieved.

Since timing provided to complete the counting operation of the up counter is generated asynchronously with the oscillating operation of each ring oscillator referred to above, fractions occur in delay stages within the ring oscillators. Since the fractions are always rounded off, they are produced as errors. In the present embodiment, the following contrivance is adopted so as to substantially count even these fractions.

The up-counting ring oscillator (RO) is constructed in such a manner that delay stages corresponding to 11 stages in total are made up of combinations of NAND gates and inverters as seen from left to right, for example and the output of the final stage at the right end is fed back to the initial stage at the left end. In this case, the NAND gate is provided as an input stage and the operation control signal UCE is supplied to the input state to stop the oscillating operation of the synchronous clock generator from being in the non-operating state, thereby limiting the waste of current consumption.

In contrast to the up-counting ring oscillator, the down-counting ring oscillator (RO) is constructed in such a manner that delay stages corresponding to 11 stages in total are made up of combinations of NAND gates and inverters, as seen from right to left, and the output of the final stage at the left end is fed back to the initial stage at the right end. In this case, the NAND gate is provided as an input stage and the operation control signal DCE is supplied to the input stage to stop the oscillating operation of the synchronous clock generator from being in the non-operating state, thereby limiting needless current consumption.

The two ring oscillators are arranged in parallel while being mirror-reversed as described above. Signals inputted to the NAND gates of the respective delay stages for the up count are respectively transmitted to the inputs of the NAND gates constituting the respective down-counting delay stages placed in the mirror-reversed relationship. Namely, a signal outputted from the final output stage of the up-counting ring oscillator is transmitted to an input of a second-stage NAND gate of the down-counting ring oscillator because the initial-stage NAND gate is used for the control of oscillation. Signals at delay stages of the up-counting ring oscillator are hereinafter successively transmitted to the down-counting ring oscillator in the substantially mirror-reversed mode.

The signals at the respective delay stages of the up-counting ring oscillator are transmitted to the down-counting ring oscillator through NAND gates whose gates are controlled by a set signal SET. Since, in this case, the up-counting ring oscillator stops oscillating according to that state with timing provided to output the set signal SET, signals outputted from the NAND gates whose gates are controlled by the set signal SET are transmitted to the down-counting ring oscillator, as described above, and to other inputs of the NAND gates corresponding to the delay stages thereof. In the down-counting ring oscillator, dummy NAND gates corresponding to the state transfer NAND gates are provided as loads. Namely, the oscillation frequencies of the two ring oscillators are set equal to each other by placing the up-counting ring oscillator and the down-counting ring oscillator under the same circuit condition.

When the set signal SET is raised to a high level so as to stop upcounting and up counts at this time are transmitted to the down counter where the signals input to the NAND gates constituting the respective delay stages for the up count are given as HHHHLL (where H: high level and L: low level), as shown in the drawing, for example, the signals HHHHLL produced from the up-counting ring oscillator are thrown onto the down-counting ring oscillator. In the up-counting ring oscillator, the signal outputted from the second-stage NAND gate supplied with H during a period in which the set signal SET is high in level, is changed to L to transition the input of the third-stage NAND gate from H to L. Outputs of H at the respective delay stages are hereafter changed to L and outputs of L result in L as they are, in the same manner as described above.

Thus, in the down-counting ring oscillator, the feedback inputs of the next-stage NAND gates are set to (L), (L), (L), (H), (H) and (H) on the basis of signals LLLHH brought to the high level of the set signal SET. In this condition, a feedback operation of the ring oscillator is started according to the transition from the outputs of the respective stages in the up-counting ring oscillator to L, whereby its oscillating operation is performed.

Figure 8:
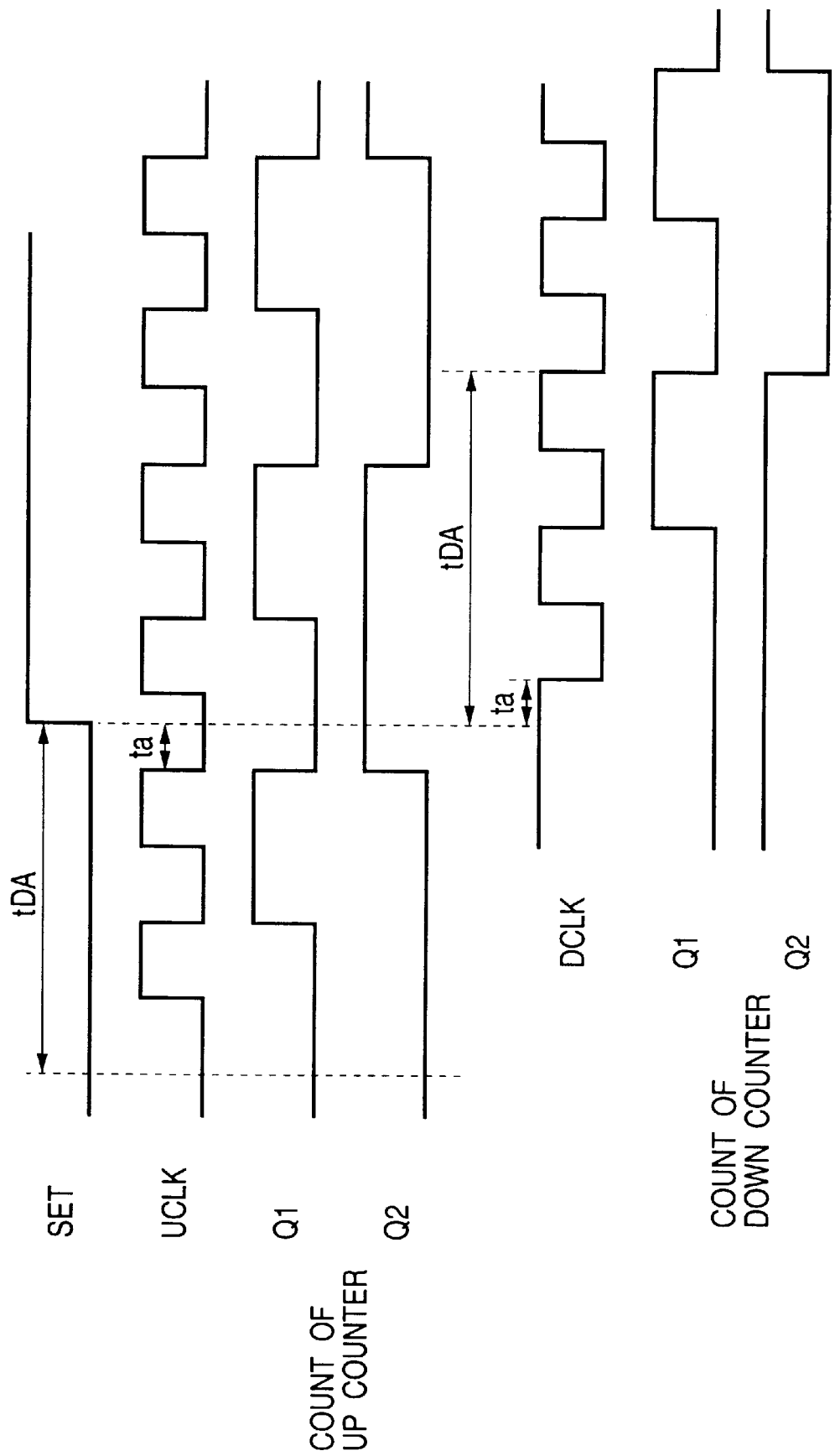
FIG. 8 is a timing chart for describing the operation of the synchronous clock generator using the ring oscillator shown in FIG. 7.

FIG. 8 is a timing chart for describing the operation of the synchronous clock generator using the above-described up-counting and down-counting ring oscillators. An upcounting clock signal UCLK is produced according to one cyclic delay time of the up-counting ring oscillator. Thus, counts Q1 and Q2 of the up counter change according to a binary counter. When the delay signal at the node n1 rises to the high level in response to the incoming of the next external clock signal, as described above, in the course of the operation of such a binary counter, and the set signal SET changes to the high level in synchronism with its rise, the counts Q1 and Q2 remain unchanged even though the upcounting clock signal UCLK is delayed by a time ta from its falling edge. Therefore, the method of transmitting only the counts of the up counter to the down counter leads to the cutting off of the time ta.

When the up-counting and down-counting ring oscillators shown in FIG. 7 are provided and the signals at the delay stages of the up-counting ring oscillator are transferred to their corresponding down-counting delay stages, from which the down-counting ring oscillator is caused to oscillate, the time ta regarded as a fraction with respect to the counts is transmitted to the down-counting ring oscillator and hence a down counting operation can be delayed by the time ta. Thus, since a substantial counting operation can be performed inclusive of the signal delayed states at the above-described ring oscillators, an advantageous effect can be obtained in that the time tDA can be generated with high accuracy.

Figure 9:
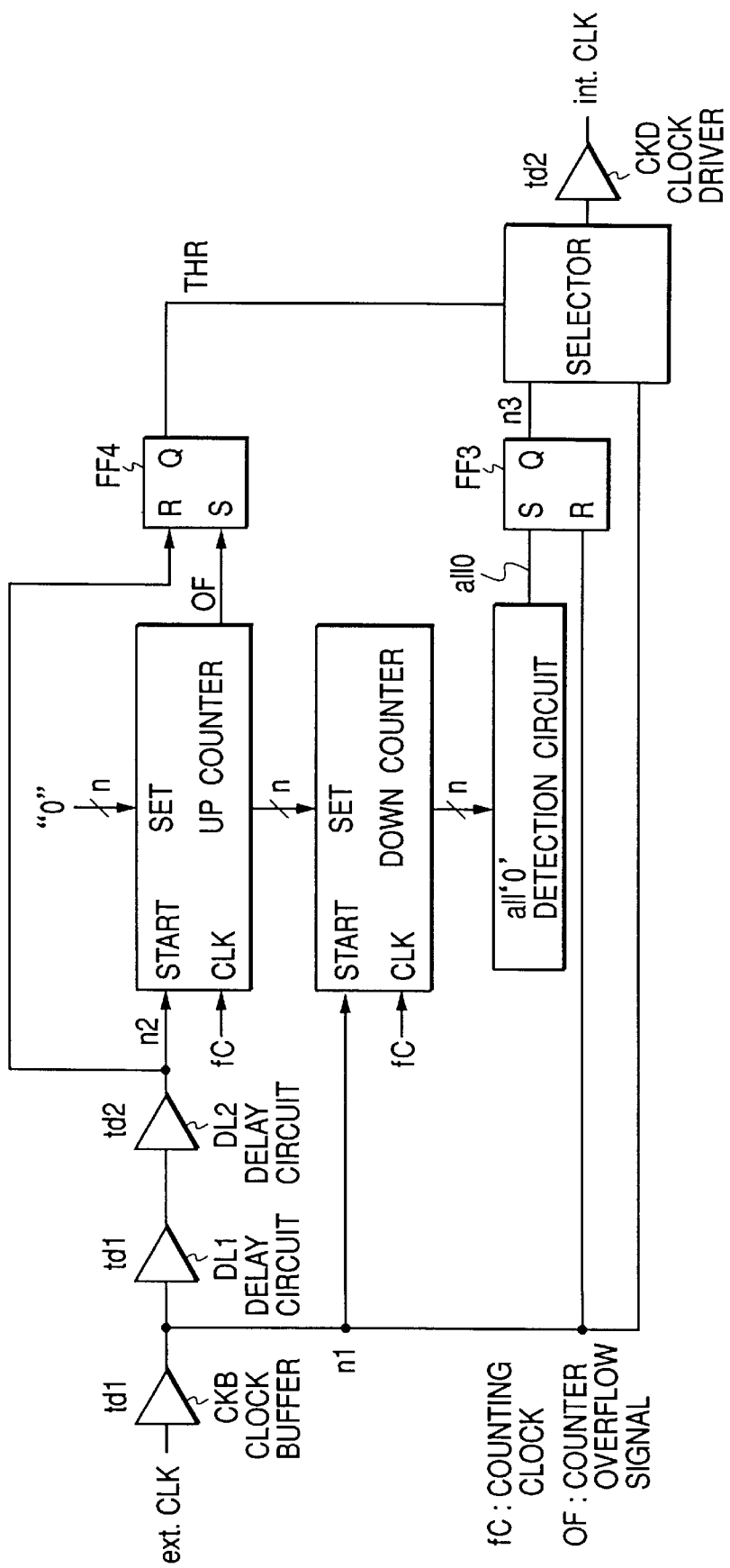
FIG. 9 is a block diagram illustrating a further embodiment of a synchronous pulse generator according to the present invention.

FIG. 9 is a block diagram showing a further embodiment of a synchronous clock generator according to the present invention. As described above, delay times are developed in a clock buffer CKB required to capture a clock signal supplied from an external terminal and a clock driver CKD for transmitting an internal clock signal to an internal circuit. Since the delay times cannot be neglected with respect to one period or cycle of the clock signal supplied from the external terminal, the synchronous clock generator described above is required. Conversely, when the frequency of the clock signal supplied from the external terminal is low and its cycle is sufficiently longer than each of the delay times, the synchronization of the synchronous clock generator does not make sense. With consideration given this point of view and the fact that the up counter substantially performs a clock or timer operation associated with the cycle of the external clock signal, an overflow-detecting flip-flop circuit FF4 is provided for the up counter.

The flip-flop circuit FF4 is set by an overflow signal OF outputted from the up counter and reset by a delay signal (node n2) outputted from the delay circuit. Further, a selector is controlled by a signal THR outputted from the flip-flop circuit FF4 so that a signal outputted from the clock buffer CKB is transmitted to the clock driver CKD as it is. With this configuration, the internal clock signal int.CLK is delayed by delay times td1 and td2 of the clock buffer CKB and the clock driver CKB with respect to the external clock signal ext.CLK supplied from the external terminal. However, since one cycle of the external clock signal ext.CLK is sufficiently longer than the delay time td1+td2, no substantial problem arises.

Figure 10:
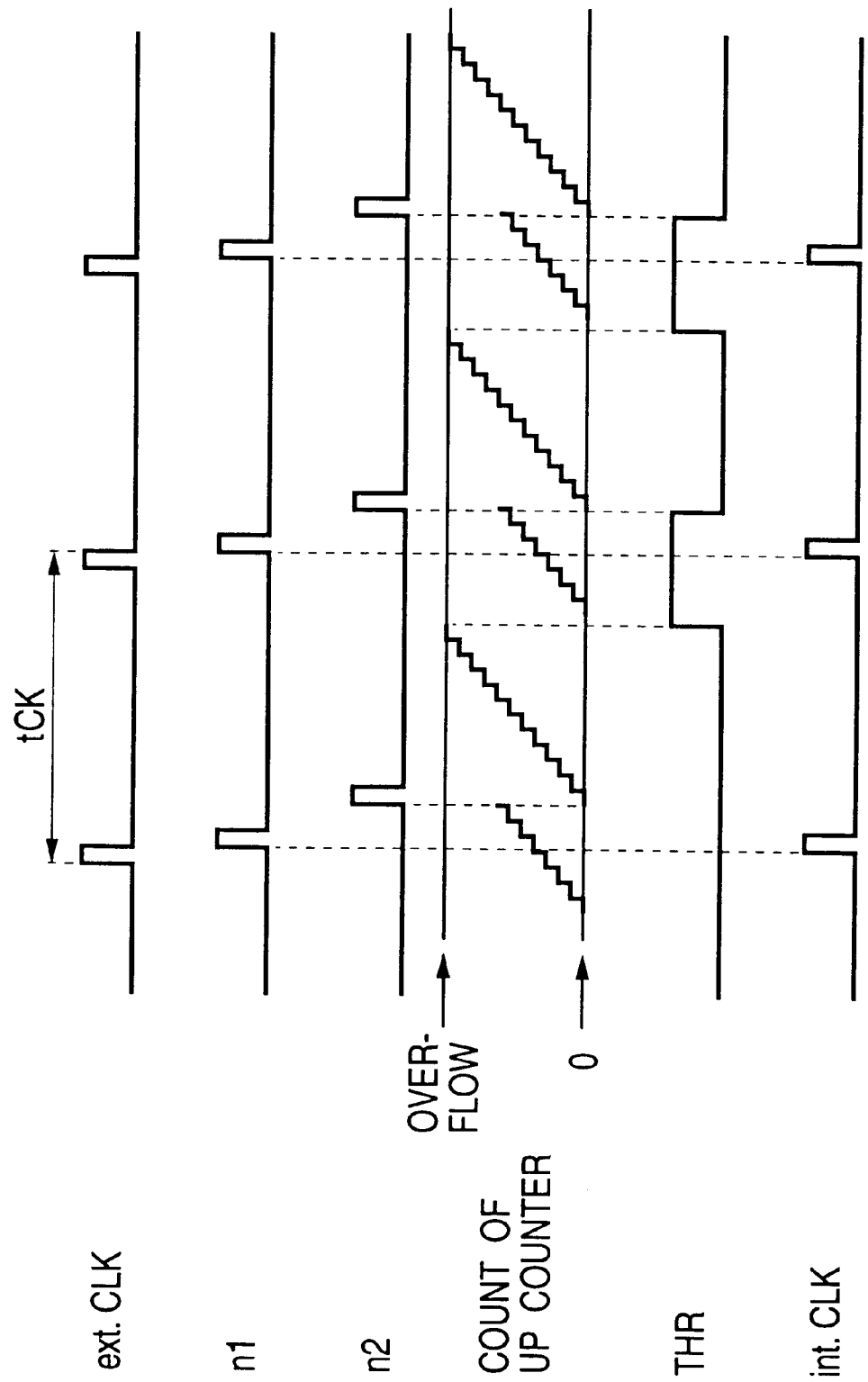
FIG. 10 is a timing chart for describing the operation of the synchronous pulse generator shown in FIG. 9.

FIG. 10 shows a timing chart for describing the operation of the synchronous clock generator shown in FIG. 9. When one cycle tCK of the external clock signal ext.CLK is long, the up counter starts counting in response to the signal at the node n2, which has been transmitted through the clock buffer and the delay circuits, and the up counter will overflow before the receipt of the signal of the next cycle at the node n1, which has been transmitted through the clock buffer. In such as case, the flip-flop circuit FF4 is set in response to the overflow signal so as to generate the signal THR. As a result, the signal at the node n1, which has passed through the clock buffer, is transmitted through the clock driver as the internal clock signal int.CLK.

Figure 13:
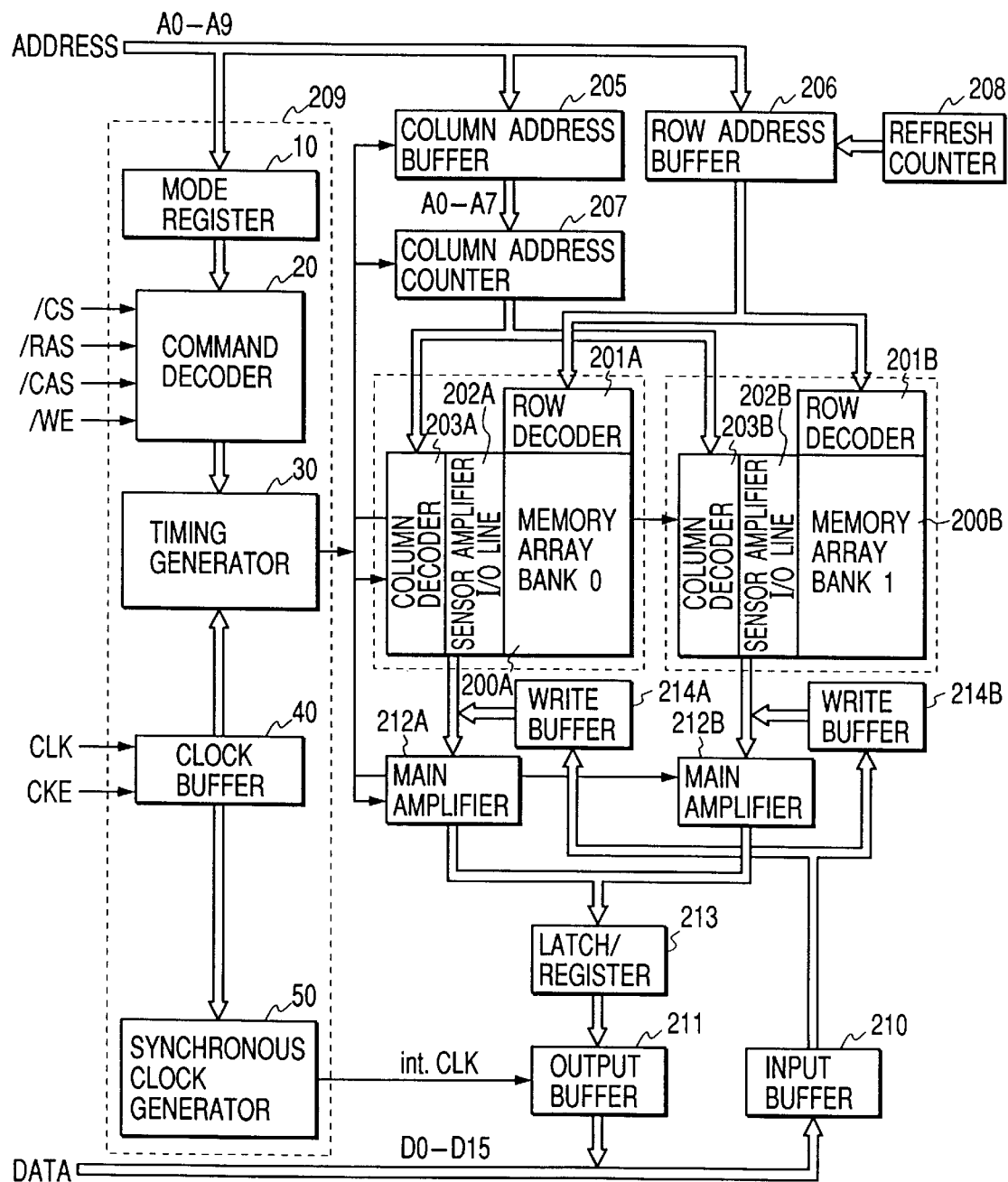
FIG. 13 is a block diagram illustrating one embodiment of the SDRAM to which the present invention is applied.

FIG. 13 illustrates the entire block diagram of one embodiment of a synchronous DRAM (hereinafter called merely "SDRAM") to which the present invention is applied. Although the invention is not restricted to the particular example, the SDRAM shown in drawing is formed on a single semiconductor substrate such as monocrystal silicon by the known semiconductor integrated circuit manufacturing techniques.

The SDRAM according to the present embodiment has a memory array 200A constituting a memory bank 0 and a memory array 200B constituting a memory bank 1. The memory arrays 200A and 200B, respectively, have dynamic memory cells arranged in matrix form. According to the drawing, selection terminals of the memory cells aligned in the same column are electrically connected to their corresponding word lines (not shown) provided for every column, whereas data input/output terminals of the memory cells aligned in the same row are electrically connected to their corresponding complementary data lines (not shown) provided for every row.

One of the unillustrated word lines of the memory array 200A is driven to a select level in accordance with the result of decoding of a row address signal by a row decoder 201A. The unillustrated complementary data lines of the memory array 200A are electrically connected to their corresponding I/O lines 202A including sense amplifiers and column selection or switch circuits. Each of the sense amplifiers included in the I/O lines 202A is an amplifier circuit for detecting and amplifying a small potential difference developed between the respective complementary data lines according to the reading of data from each memory cell. The column switch circuits included in the I/O lines 202A are switch circuits for individually selecting the corresponding complementary data lines and for providing conduction or continuity between the selected complementary data lines and the complementary I/O lines. The column switch circuit is selectively activated in accordance with the result of decoding of a column address signal by a column decoder 203A.

Similarly, a row decoder 201B, I/O lines 202B including sense amplifiers and column selection circuits, and a column decoder 203B are provided on the memory array 200B side. The complementary I/O lines are electrically connected to output terminals of write buffers 214A and 214B and input terminals of main amplifiers 212A and 212B. Signals outputted from the main amplifiers 212A and 212B are transmitted to an input terminal of a latch/register 213. A signal outputted from the latch/register 213 is outputted from an external terminal through an output buffer 211. A write signal inputted from the external terminal is transmitted to input terminals of the write buffers 214A and 214B through an input buffer 210. Although the invention is not restricted to the particular example, the external terminal serves as a data input/output terminal for outputting data D0 through D15 composed of 16 bits.

Address signals A0 through A9 supplied from address input terminals are taken in or brought into a column address buffer 205 and a row address buffer 206 in address multiplex form. The supplied address signals are held by their corresponding buffers. Upon a refresh operating mode, the row address buffer 206 captures a refresh address signal outputted from a refresh counter 208 as a row address signal. The output of the column address buffer 205 is supplied to a column address counter 207 as preset data thereof. The column address counter 207 outputs the column address signals used as the preset data or values obtained by successively incrementing the column address signals to the column decoders 203A and 203B according to operating modes specified by commands or the like to be described later.

Although the invention is not restricted to the particular example, a controller 209 indicated by the dotted line is supplied with external control signals, such as a clock signal CLK, a clock enable signal CKE, a chip select signal ICS, a column address strobe signal /CAS (symbol / means that signals marked with / are row enable signals), a row address strobe signal /RAS, and a write enable signal /WE, etc., and control data corresponding to the address signals A0 through A9 inputted from the address input terminals. The controller 209 serves to produce internal timing signals for controlling the operating mode of the SDRAM and the operations of the above circuit blocks, based on changes in levels of these signals, the timing provided therefor and the like. Further, the controller 209 has a mode register 10, a command decoder 20, a timing generator 30, a clock buffer 40 and a synchronous clock generator 50.

A clock signal CLK is inputted to the synchronous clock generator through the clock buffer 40, as described above, and is synchronized with an internal clock signal generated from the synchronous clock generator. Although the invention is not restricted to the particular example, the internal clock is used as a timing signal int.CLK for activating the output buffer 211 and the signal transmitted through the clock buffer 40 is sent to other circuits as it is. Other external input signals are rendered significant in synchronism with the leading edge of the internal clock signal. The chip select signal /CS provides instructions for starting a command input cycle according to its low level. When the chip select signal /CS is high in level (in a chip non-selected state), other inputs do not sense. However, internal operations to be described later, such as the selected state of a memory bank, a burst operation, etc. are not affected by the change to the chip non-selected state. The respective signals of /RAS, /CAS and /WE are different in function from corresponding signals employed in the normal DRAM and are set as significant signals when a command cycle to be described later is defined.

The clock enable signal CKE is a signal for providing instructions for validity of the next clock signal. If the clock enable signal CKE is high in level, then the leading edge of the next clock signal CLK is made effective or significant, whereas when the clock enable signal CKE is low in level, it is rendered insignificant. When an external control signal /OE for performing output enable control on the output buffer 211 in a read mode is provided, although this is not shown in the drawing, the external control signal /OE is also supplied to the controller 209. When the external control signal /OE is high in level, for example, the output buffer 211 is brought to a high-output impedance state.

The row address signal is defined according to levels of A0 through A8 in a row address strobe.bank active command cycle to be described later, which is synchronized with the leading edge of the clock signal CLK (internal clock signal).

The address signal A9 is regarded as a bank select signal in the row address strobe.bank active command cycle. Namely, when the address signal A9 is low in level, the memory bank 0 is selected, whereas when the address signal A9 is high in level, the memory bank 1 is selected. Although the invention is not restricted to the particular example, the control of the selection of the memory bank can be performed in accordance with various processes, such as the activation of the row decoder alone on the selected memory bank side, the non-selection of all the column switch circuits on the non-selected memory bank side, connections to the input buffer 210 and the output buffer 211 on the selected memory bank side alone, etc.

The address signal A8 in a precharge command cycle to be described later specifies a mode for precharging the complementary data lines or the like. A high level thereof indicates that the objects to be precharged are both memory banks, whereas a low level thereof indicates that one memory bank specified by the address signal A9 is an object to be precharged.

The column address signal is defined according to levels of A0 through A7 in a read or write command (corresponding to a column address.read command or column address.write command to be described later) synchronized with the leading edge of the clock signal CLK (internal clock). The so-defined column address signal is defined as a start address for a burst access.

Main operating modes of the SDRAM, which are respectively specified by the commands, will next be described.

(1) Mode Register Set Command (Mo):

The present command is a command for setting the mode register 30. The corresponding command is specified according to a low level=/CS, /RAS, /CAS or /WE and data (register set data) to be set are given through A0 through A9. Although the invention is not restricted to the particular example, the register set data may include burst lengths, CAS latency, a write mode, etc and, the burst lengths to be settable may include 1, 2, 4, 8 and a full page, the CAS latency to be settable may include 1, 2 and 3, and the write mode to be settable may include burst write and single write.

The CAS latency is used to specify how many cycles of the internal clock signal should be spent from the falling edge of the /CAS to the output operation of the output buffer 211 upon the read operation instructed by the column address read command to be described later. An internal operating time required to read data is needed till the determination of the read data. The CAS latency is used to set the internal operating time according to the frequency of the internal clock signal. In other words, when an internal clock signal having a high frequency is used, the CAS latency is set to a relatively large value. On the other hand, when an internal clock signal having a low frequency is used, the CAS latency is set to a relatively small value.

(2) Row Address Strobe.Bank Active Command (Ac):

This is a command for making instructions provided for a row address strobe and the selection of the memory bank by A9 effective or significant. The present command is specified according to /CS and /RAS=a low level and /CAS and /WE=a high level. At this time, each of the addresses supplied to A0 through A8 is captured as a row address signal, and a signal supplied to A9 is captured as a memory bank select signal. This capturing operation is performed in synchronism with the leading edge of the internal clock signal as described above. When the corresponding command is specified or designated, for example, a word line for a memory bank specified by the command is selected and memory cells electrically connected to the corresponding word line are conducted on their corresponding complementary data lines.

(3) Column Address.read Command (Re):

This command is a command required to start a burst read operation and for providing instructions for a column address strobe. The present command is specified according to /CS and /CAS=a low level and /RAS and /WE=a high level. At this time, each of column addresses supplied to A0 through A7 is captured as a column address signal. Thus, the captured column address signal is supplied to the column address counter 207 as a burst start address. Upon the burst read operation specified by the burst start address, a memory bank and its corresponding word line are selected in the row address strobe.bank active command cycle before the burst read operation. Memory cells connected to the corresponding selected word line are successively selected in accordance with the address signals outputted from the column address counter 207 in synchronism with the internal clock signal and data are sequentially read from the memory cells. The number of the data sequentially read from the memory cells is set to a number designated in accordance with the above-described burst length. A start operation for reading data from the output buffer 211 is carried out while awaiting the number of cycles of the internal clock signal defined by the CAS latency.

(4) Column Address.write Command (Wr):

This is defined as a command necessary to start a burst write operation when burst write is being set to the mode register 10 as a write operating mode. Further, the present command is defined as a command required to start a single write operation when single write is being set to the mode register 10 as the write operating mode. Moreover, the command gives column address strobe instructions for the single write and burst write. The command is specified according to /CS, /CAS and /WE =a low level and /RAS=a high level. At this time, each of the addresses supplied to A0 through A7 is captured as a column address signal. Thus, the captured column address signal is supplied to the column address counter 207 as a burst start address upon the burst write. The procedure for the burst write operation instructed by the command is also carried out in a manner similar to the burst read operation. However, no CAS latency exists upon the write operation and the capturing of write data is started from the column address.write command cycle.

(5) Precharge Command (Pr):

This is a command required to start a precharge operation with respect to the memory banks selected by A8 and A9. The command is specified according to /CS, /RAS and /WE=a low level and /CAS=a high level.

(6) Auto Refresh Command:

This is a command required to start auto refresh and is specified according to ICS, /RAS and /CAS=a low level and /WE and CKE=a high level.

(7) Burst Stop.in.fullpage Command:

This is a command required to stop a fullpage burst operation over all the memory banks and is neglected upon a burst operation other than the full page burst operation. This command is specified according to /CS and /WE=a low level and /RAS and /CAS=a high level.

(8) No-operation Command (Nop):

This is a command for providing instructions for substantial non-operation. The command is specified according to /CS=a low level and /RAS, /CAS and /WE=a high level.

When another memory bank in the SDRAM is specified in the course of the burst operation of one memory bank when its burst operation is being performed and the row address strobe.bank active command is supplied, a row address system operation of another memory bank is enabled without exerting any influence on the operation of one memory bank, while it is being executed. The SDRAM has, for example, means for storing therein data, addresses and control signals supplied from the outside. Although the invention not restricted particular example, the contents held therein, particularly, the addresses and the control signals, are held in every memory. Alternatively, data corresponding to one word line in a memory block selected by a row address strobe.bank active command cycle is to be held in the latch/register 213 to perform a read operation in advance before a column system operation.

Thus, unless the data D0 through D15 composed of 16 bits coincide with each other at the data input/output terminal, for example, the precharge command and the row address strobe.bank active command can be issued to a memory bank different from a memory bank to be processed by a non-processed command being executed while the non-processed command is under execution, so as to start an internal operation in advance.

Since the SRAM is able to input and output the data, addresses and control signals in synchronism with the clock signal CLK (internal clock signal), a mass storage memory similar to the DRAM can be activated at a high speed equivalent to that of an SRAM. It will be understood that the number of data that should be accessed to the selected one word line is specified according to burst lengths to thereby successively switch between selected states in a column system by the built-in column address counter 207, whereby a plurality of data can be sequentially read or written.

In the present embodiment, the output buffer is controlled based on the internal clock signal int.CLK produced by the synchronous clock generator, as described above. Thus, an output signal D0 can be outputted with a delay of only an operation delay time tD0 of the output buffer from the leading edge of the internal clock signal int.CLK synchronized in phase with the external clock signal ext.CLK, as shown in an operation waveform chart of FIG. 14B. As described above, the operation delay time tD0 is equal to a time tAC between the generation of the clock signal and the output of the data, and this results in high speed operation.

Figure 14A:
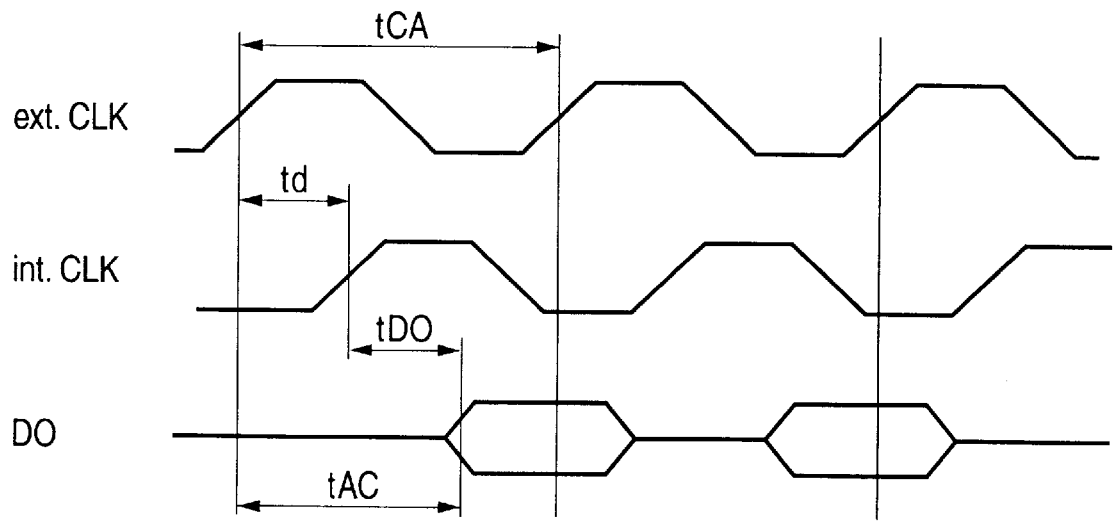
FIGS. 14A and 14B are timing charts for describing one example of the operation of the SDRAM shown in FIG. 13.
Figure 14B:
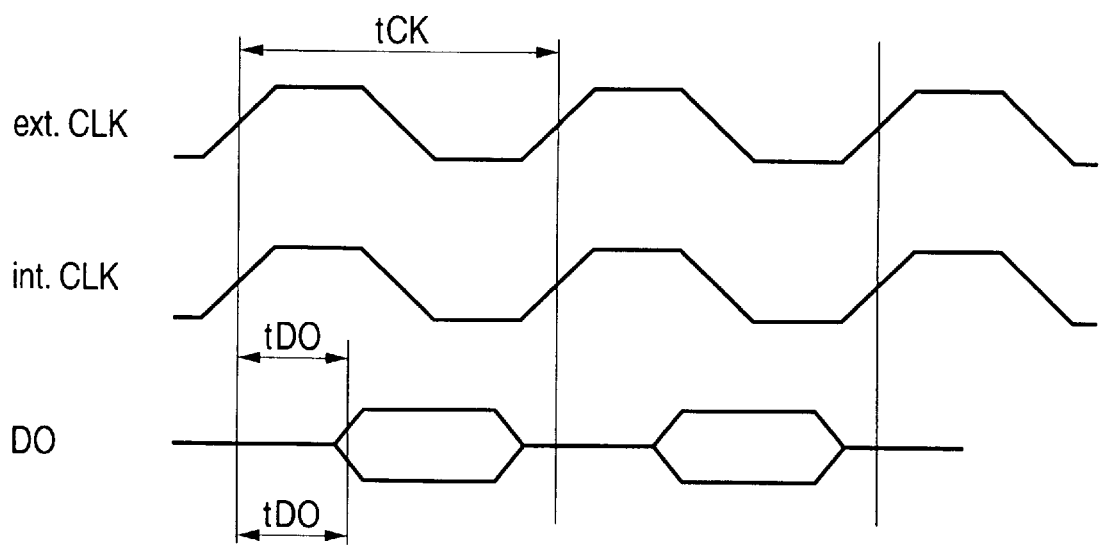

Namely, in a circuit free of the above-described synchronous clock generator, the operation delay time tD0 of the output buffer is added to a delay time td consumed by each of the clock buffer and the clock driver as viewed or counted from the external clock signal ext.CLK so as to lengthen the time tAC as shown in FIG. 14A. Therefore, the delay time td cannot be neglected at a high frequency in which one cycle tCK of the clock signal CLK becomes short, thereby leading to interference with an attempt at speeding up the operation. Incidentally, since one cycle of the clock signal CLK becomes 4nsec if the frequency of the clock signal CLK is set as 250 MHz, the non-use of the synchronous clock generator referred to above makes it impossible to perform a read operation based on such a clock signal.

Figure 11:
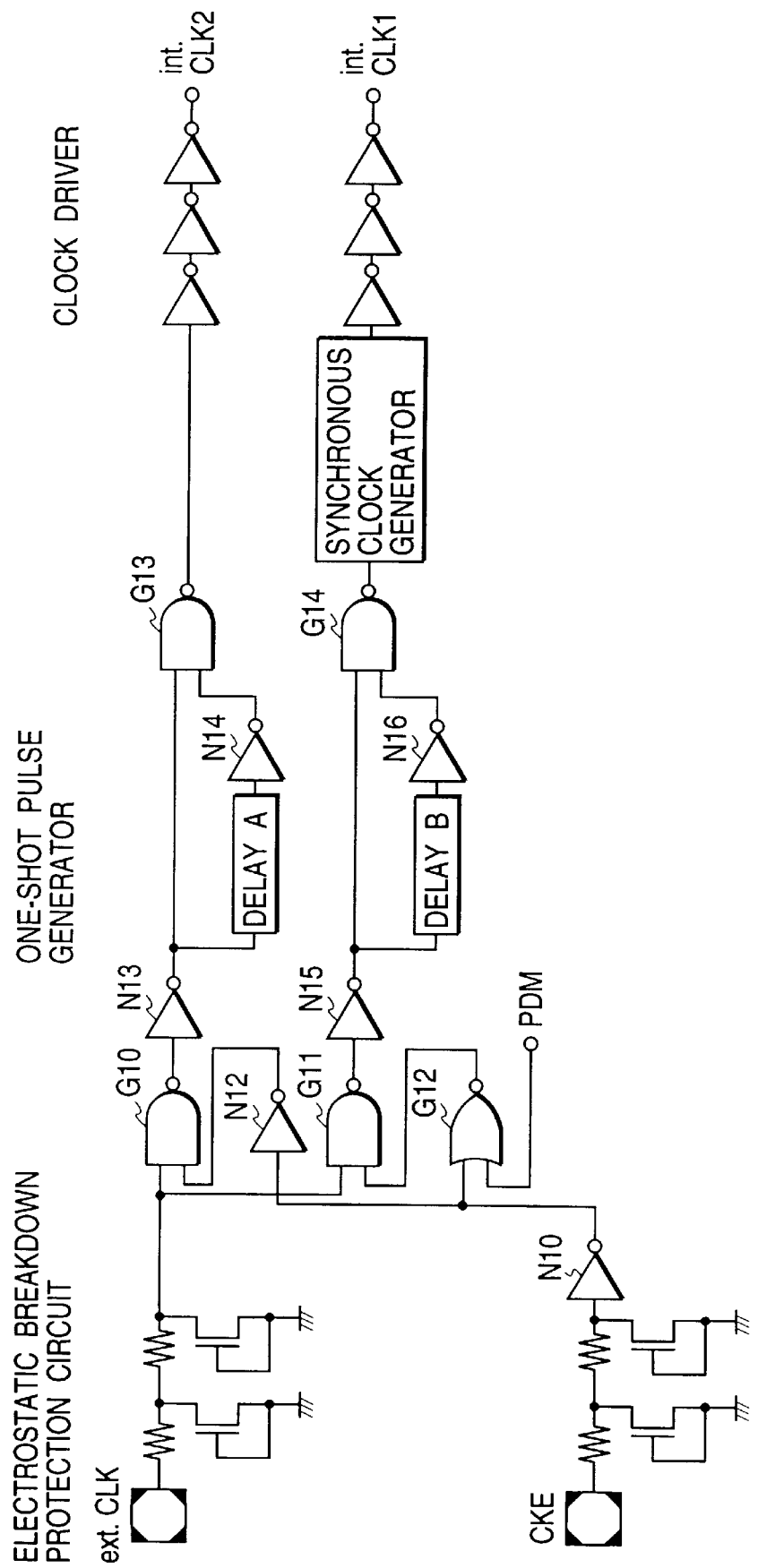
FIG. 11 is a schematic circuit diagram showing one example of a clock buffer provided in an SDRAM to which the present invention is applied.

FIG. 11 is a circuit diagram of one example of the clock buffer 40 shown in FIG. 13. The clock buffer comprises a portion for capturing a clock signal transmitted to the above-described synchronous clock generator and a portion for capturing a clock signal supplied to another timing generator or the like. When a clock enable signal CKE is high in level, the capturing of the external clock signal ext.CLK is made effective or significant. Therefore, a clock signal inputted through the known electrostatic breakdown protection circuit composed of resistive elements and MOSFETs provided in diode form is supplied to one of the inputs of the NAND gates G10 and G11. The clock enable signal CKE inputted through an electrostatic breakdown protection circuit similar to the circuit described above is transmitted to the other input of the NAND gate G10 through inverters N10 and N12 constituting an input buffer. When the clock enable signal CKE is high in level, the NAND gate G10 is gated or enabled to capture the external clock signal ext.CLK, followed by supply to a one-shot pulse generator.

In the SDRAM, all the signal processes are performed at the leading edge of a clock pulse. Thus, in the present embodiment, the one-shot pulse generator generates a pulse having a pulse width determined by a delay time developed by a delay circuit delay A in synchronism with the leading edge of the clock pulse. Further, a series or train of CMOS inverters, that constitutes a clock driver, outputs an internal clock signal int.CLK2 and transmits it to internal circuits other than the above-described output buffer.

The SDRAM has a power down mode for bringing the output buffer to a non-operating state when the power down mode is specified by the mode register or the like. Therefore, the clock enable signal CKE serves to control a NAND gate G11 for capturing the external clock signal ext.CLK through a NOR gate G12 controlled by a power down signal PDM so that the supply of the clock signal to the synchronous clock generator is stopped. Namely, if the power down signal PDM is high in level even if the clock enable signal CKE is at a high level, then a signal outputted from the NOR gate G12 is rendered low in level to disable or close the NAND gate G11, whereby the capturing of the external clock signal ext.CLK is stopped. Thus, the synchronous clock generator brings the output buffer to the non-operating state, while the internal clock signal int.CLK1 remains at a low level.

The internal clock signal int.CLK for controlling the operation of the output buffer is produced by the above-described synchronous clock generator. However, the above-described one-shot pulse generator is provided at its input. Namely, the clock buffer CKB employed in the embodiment comprises a three-stage circuit made up of the electrostatic breakdown protection circuit, the gates and the one-shot pulse generator. Although the invention is not restricted to the particular example, the clock driver CKD is made up of a three-stage CMOS inverter. Namely, an output-stage CMOS inverter composed of a large output MOSFET is driven at high speed to successively increase the drive capability of the clock driver CKD so as to drive a large capacitive load.

Figure 12:
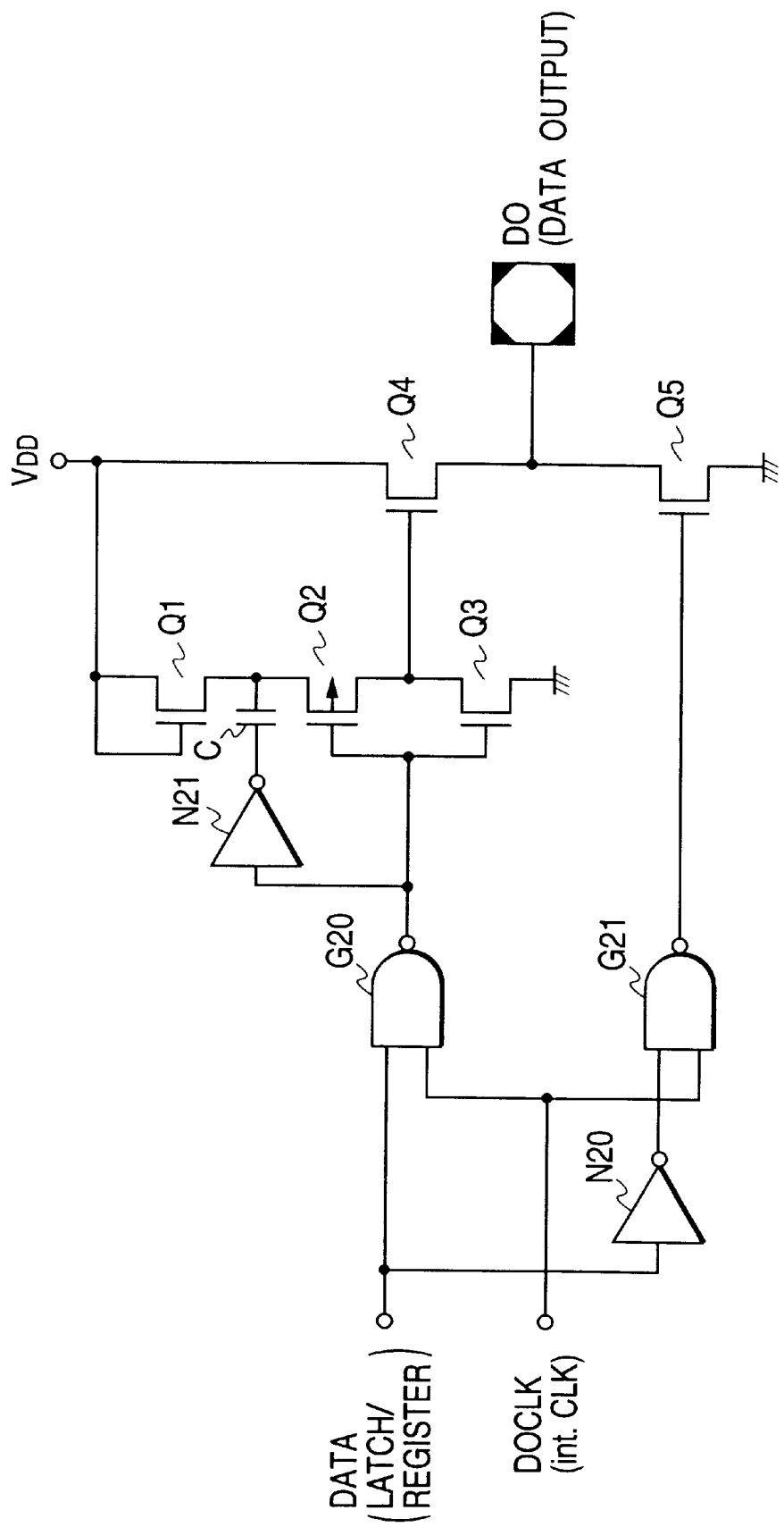
FIG. 12 is a schematic circuit diagram depicting one example of an output buffer provided in the SDRAM to which the present invention is applied.

FIG. 12 is a circuit diagram showing one example of the output buffer. In the drawing, one output circuit corresponding to one bit is illustrated as a typical one. Namely, when the data is outputted in 16-bit units, as described above, sixteen circuits of the type shown in the drawing are needed. A clock signal DOCLK (int.CLK) for controlling the operation of each output buffer is commonly supplied to all of the output buffers.

The output buffer is provided with N-channel output MOSFETs Q4 and Q5, and a drive circuit composed of NAND gates G20 and G21 and an inverter N20 to complementarily bring the output MOSFETs Q4 and Q5 to an on/off state in association with data DATA, when in operation, and bring both the output MOSFETs Q4 and Q5 to the off state, when not in operation, so as to set each of them to an output high impedance state. In order to increase the voltage applied to the gate of the output MOSFET Q4 on the power source voltage VDD side to above the power source voltage VDD to thereby allow a high-level output signal to reach the power source voltage VDD, a booster circuit composed of MOSFETs Q1 through Q3, an inverter N21 and a capacitor C is provided.

When the clock signal DOCLK is in a non-operating state indicative of a low level, the output of the NAND gate G20 is rendered high in level without reference to the data DATA to turn on the N-channel MOSFET Q3. As a result, the voltage at the gate of the output MOSFET Q4 is brought to a ground potential to turn off the output MOSFET Q4. At this time, the output of the inverter N21 results in a low level and the capacitor C is precharged through the diode MOSFET Q1. If the clock signal DOCLK changes to an operating state indicative of a high level and the data DATA is high in level, then the output of the NAND gate G20 is rendered low in level so that the signal outputted from the inverter N21 changes from the low level to the high level.

The capacitor C produces a boosted voltage obtained by adding the high level outputted from the inverter N21 to the precharged voltage. Since the N-channel MOSFET Q3 and the P-channel MOSFET Q2 are respectively brought to an off state and an on state due to the low level of the output signal of the NAND gate G20, the boosted voltage of the capacitor C is transmitted to the gate of the output MOSFET Q4 through the turned-on MOSFET Q2, so that the voltage thereof is boosted to above the power source voltage VDD. As a result, the voltage results in a high level like a high level power source voltage VDD of data D0 outputted from an output terminal. If the data DATA to be outputted is low in level, then a signal outputted from the NAND gate G21 is brought to a high level to turn on the output MOSFET Q5 from which a low level like the ground potential in the circuit is outputted.

Since the data DATA to be outputted from the output buffer is being held in the latch/register, the output buffer starts operating in synchronism with the leading edge of the clock signal DOCLK produced from the synchronous clock generator so as to synchronize the signal DOCLK with the external clock signal ext.CLK, thereby making it possible to equalize the above access time tAC and the operation delay time of the output buffer and to shorten the access time tAC.

Figure 15:
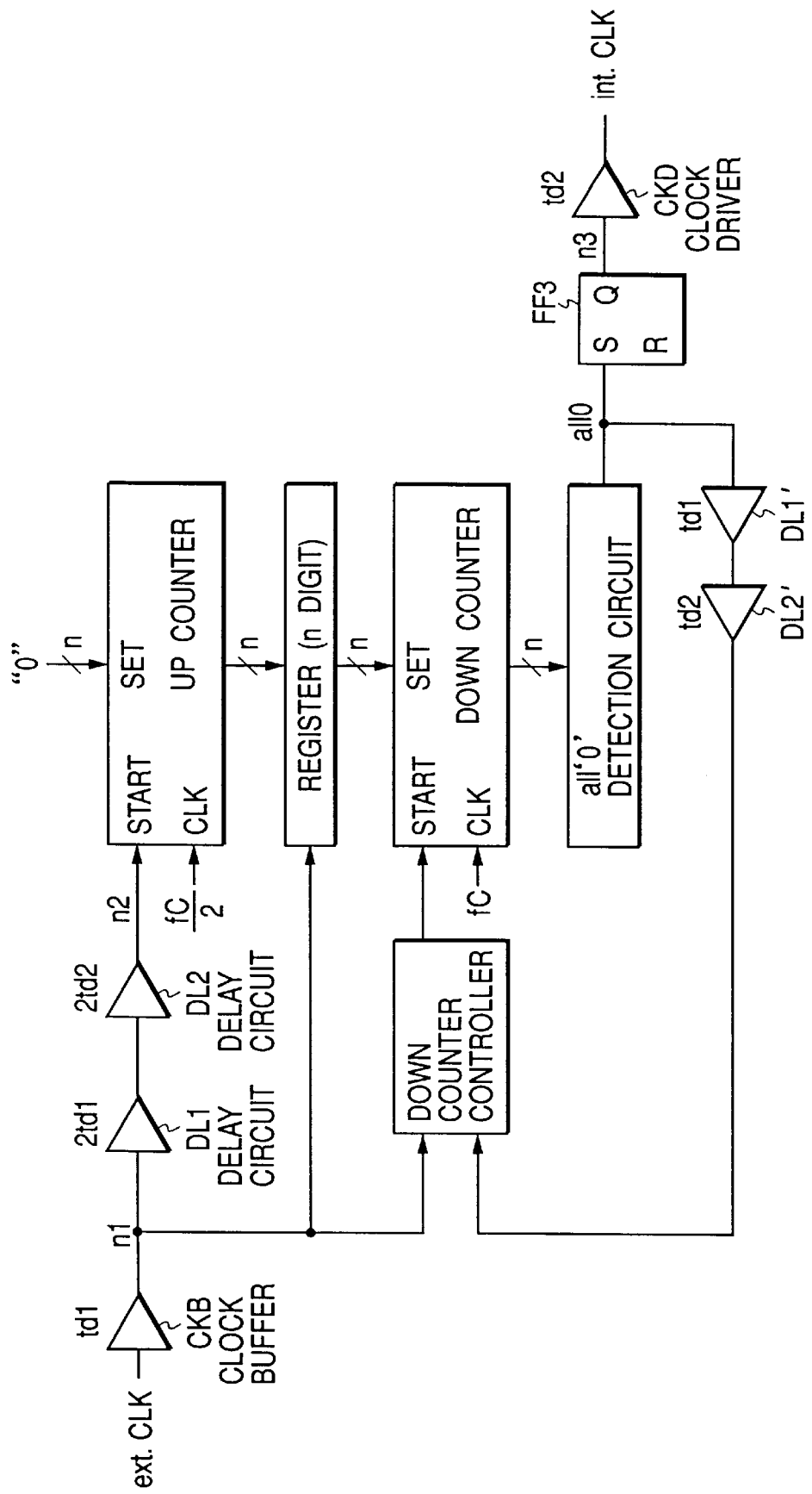
FIG. 15 is a block diagram depicting a still further embodiment of a synchronous pulse generator according to the present invention.

FIG. 15 is a block diagram showing a still further embodiment of a synchronous clock generator according to the present invention. In the present embodiment, a frequency multiplication function is additionally provided as well as the synchronization of an external clock signal with an internal clock signal. Although the invention is not restricted to the particular example, an internal clock signal int.CLK synchronized with an external clock signal ext.CLK and whose frequency is set to twice the frequency thereof, is produced in the present embodiment.

The present synchronous clock generator is similar in basic circuit to the aforementioned synchronous clock generator. However, delay circuits DL1 and DL2 are respectively set to delay times 2td1 and 2td2 each corresponding to twice the previous delay time to produce the internal clock signal int.CLK whose frequency is doubled. Further, a count clock of an up counter is set to a half frequency fC/2 equal to one-half of the count clock frequency fC of a down counter without setting the up counter and the down counter to the same count clock frequency. Namely, the count clock frequency fC of the down counter is divided by ½ to produce the count clock frequency fC/2 of the up counter.

A count output of the up counter is held in a register and thereafter transmitted to the down counter through the register. A signal outputted from an a110 detection circuit supplied with the output of the down counter is used as a signal for setting a flip-flop circuit FF3 as described above and is transmitted to a down counter controller through delay circuits DL1' and DL2'. The down counter controller generates a start input signal from the signal at the output node n1 of the above-described clock buffer CKB and the detected signal a110 transmitted through the delay circuits DL1' and DL2'. Although omitted in the drawing, the flip-flop circuit FF3 is reset in accordance with the supply of a signal obtained by delaying the detected signal a110 to a reset terminal of the flip-flop circuit FF3, and correspondingly the pulse width of an internal clock signal int.CLK outputted from the clock driver CKD is set. Therefore, a one-shot pulse generator may be used in place of the flip-flop circuit FF3. The delay times of the delay circuits DL1' and DL2' are set as td1 and td2.

Figure 16:
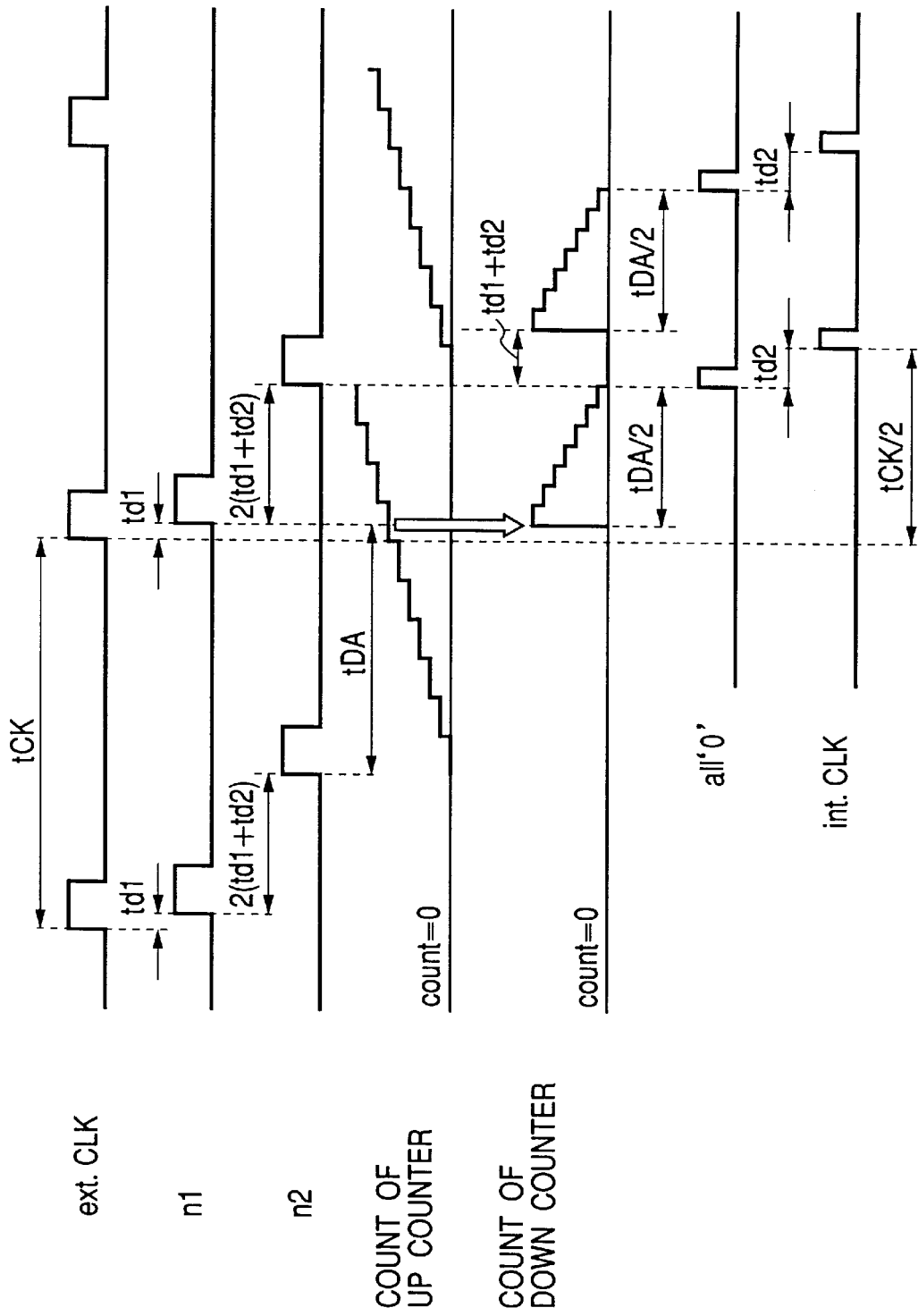
FIG. 16 is a timing chart for describing the operation of the synchronous pulse generator shown in FIG. 15.

FIG. 16 is a timing chart for describing the operation of the synchronous clock generator shown in FIG. 15. The external clock signal ext.CLK rises to a high level and the signal at the node n1 is changed to a high level after only a delay time td1 of the clock buffer CKB from its leading edge. A signal at a node n2 is changed to a high level with a further delay of 2(td1+td2) from the change of the signal at the node n2 to the high level. Thus, the up counter is supplied with a start signal so as to start the counting of count clock signal fC/2.

The next incoming external clock signal ext.CLK is raised to the high level and the output node n1 of the clock buffer CKB rises to the high level after the elapse of the delay time td1. Thus, the down counter is supplied with a down counter start signal from the down counter controller and thereby captures a count of the up counter as an initial value through the register and thereafter starts the above counting of count clock signal fC. With respect to this counting, the time required to reach a count 0 is set to half of tDA/2 because the frequency of the count clock signal fC is set to twice that of the count clock signal fC/2 of the up counter. As a result, a detected signal a110 is produced based on tDA/2 and a start signal is inputted to the down counter through the down counter controller again after the elapse of a delay time td1+td2 developed through the delay circuits DL1' and DL2'. Therefore, the down counter captures the up count held in the register as an initial value and starts the above counting of count clock fC.

According to this counting, the time required to reach a count 0 is set to half of tDA/2 in the same manner as described above because the frequency of the count clock signal fC is set to twice that of the count clock signal fC/2 of the up counter as described above. As a result, the down counter counts tDA/2+tDA/2=tDA in accordance with the two counting operations thereof. The so-produced internal clock signal int.CLK is set to a signal which has a frequency corresponding to twice that of the external clock signal ext.CLK and is synchronized with the external clock signal ext.CLK. With this configuration, the internal clock signal int.CLK synchronized with the external clock signal ext.CLK and having a frequency corresponding to twice that thereof can be formed as shown in the drawing after the input of two pulses of the external clock signal ext.CLK. This configuration has a feature in that, since its response is fast and a feedback loop does not exist as compared with a conventional configuration using a PLL circuit, the synchronous clock generator is stably activated even if a digital circuit is mixed therein.

Figure 17:
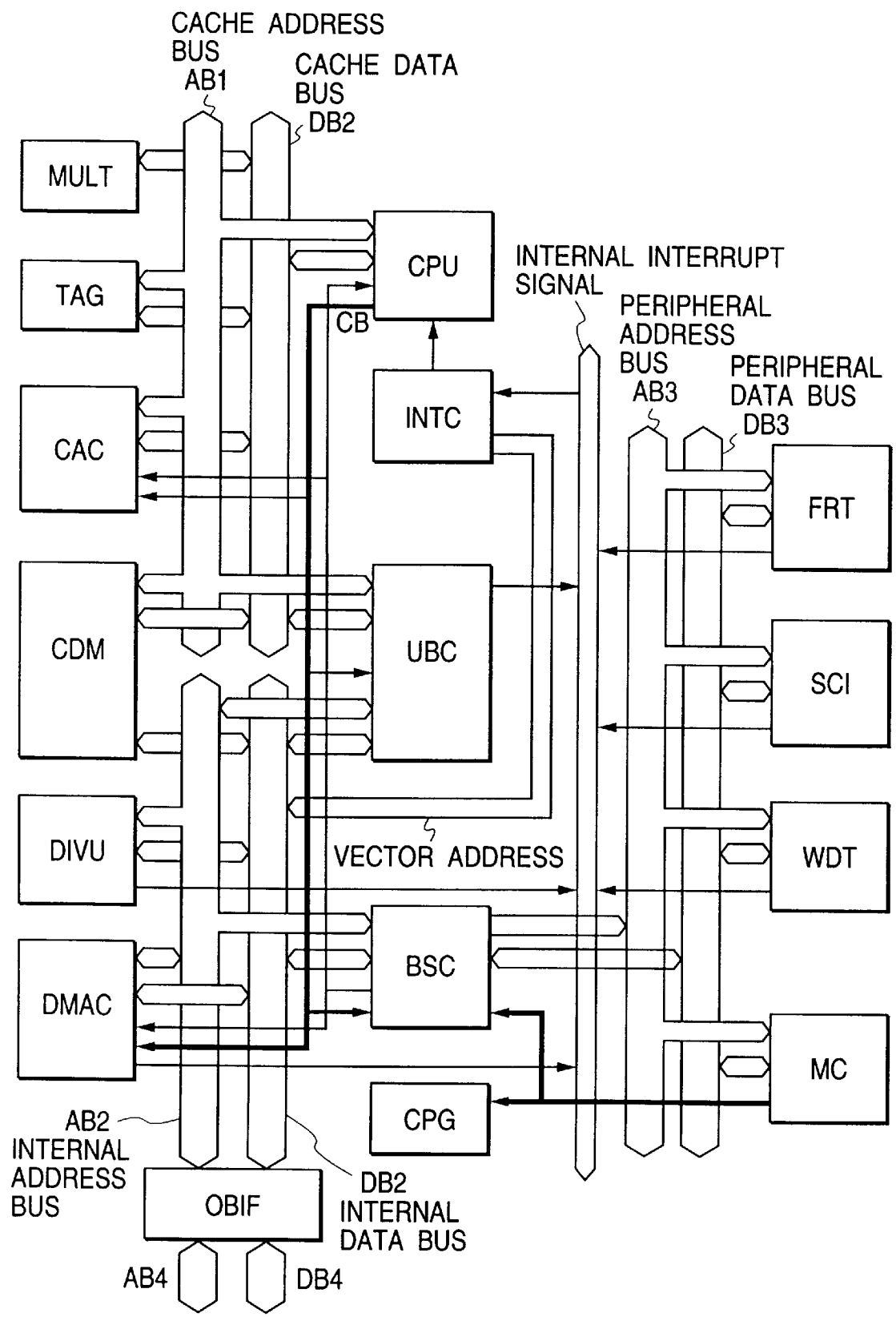
FIG. 17 is a block diagram showing one example of a single chip microcomputer to which the present invention is applied.

FIG. 17 is a block diagram showing one embodiment of a single chip microcomputer of a type to which the present invention may be applied. Respective circuit blocks shown in the drawing are formed on a single substrate such, as a monocrystal silicon substrate made by known CMOS (complementary MOS) semiconductor integrated circuit manufacturing techniques.

Although the invention is not restricted to the particular example, the single chip microcomputer referred to above is a new-generation oriented one wherein a high-performance computing process has been implemented by a central processing unit CPU of a RISC (Reduced instruction set computer) type and less power consumption indispensable for applications, such as a portable apparatus, has been realized simultaneously with the integration of peripheral devices necessary for a system configuration.

The central processing unit CPU has a RISC type command or instruction set. Since the central processing unit CPU performs a pipeline process and is thereafter activated in the form of one state per instruction (in one system clock cycle) with respect to a basic command or instruction, the execution speed of an instruction can be improved significantly. Further, the single chip microcomputer has a multiplier MULT incorporated therein and performs even a sum-of-products or AND-OR an computing process at high speed.

In order to allow a user system to be made up of the minimum number of parts, the single chip microcomputer has, as built-in peripheral modules, an interrupt controller INTC, a direct memory access controller DMAC, a divider unit DIVU, timers FRT and WDT and a serial communication interface SCI incorporated therein. Further, the single chip microcomputer can be directly connected to a dynamic RAM (Random Access Memory), a synchronous dynamic RAM and a pseudo static RAM without glue logic according to an external memory access support function with a cache memory incorporated therein.

Internal buses are classified into three types to efficiently activate the peripheral modules provided for high performance, high function or multifunction while sufficiently exhibiting the performance of the high-speed central processing unit CPU and achieving less power consumption with stress being laid on the central processing unit CPU.

The first bus comprises an address bus AB1 and a data bus DB1 to which the central processing unit CPU, the multiplier (sum-of-products computing unit) MULT and the cache memory are connected. The multiplier MULT is electrically connected to only the data bus DB1 of the first bus and is activated integrally with the central processing unit CPU so as to perform multiplication and addition. Therefore, the first bus (AB1, DB1) can be referred to as "cache address bus and cache data bus" because the first bus is utilized to principally transfer data between the central processing unit CPU and the cache memory. The cache memory is comprised of a tag memory TAG, a data memory CDM and a cache controller.

The detailed configuration of the central processing unit CPU is designed for 32 bits. A general purpose register machine comprises sixteen 32-bit general purpose registers, three 32-bit control registers and four 32-bit system registers. The RISC type instruction set is intended for code efficiency on the basis of a 16-bit fixed-length command or instruction. The disturbance of pipelines at their branch is lessened by setting an uncondition/condition branch instruction in a delay branch style. The execution of an instruction is defined as one instruction per state and is speeded up as expressed in 35 ns per instruction when the central processing unit CPU operates at 28.7 MHz. The performance of the central processing unit CPU is determined by its operating frequency and the number of cycles per instruction. It is convenient to set the operating frequency to 28.7 MHz if a clock signal is shared between the central processing unit CPU and a television video signal processing system. Incidentally, when image data is non-interlaced displayed on an NTSC color television, a clock signal (28.6 MHz) corresponding to eight times the color subcarrier frequency (about 3.58 MHz) is normally employed in a video signal circuit.

In the present embodiment, the central processing unit CPU is electrically connected to the first bus (AB1 and DB1) to which only the cache memory (TAG, CAC and CDM) and the multiplier MULT are connected. Therefore, the load capacity of each bus can be greatly reduced. Further, a bus drive circuit of the central processing unit CPU for performing the above-described high-speed operation can be simplified and less power consumption thereof can be achieved.

The second bus comprises an address bus AB2 and a data bus DB2 to which the divider unit DIVU, the direct memory access controller DMAC and the external bus interface OBIF are connected. When the cache memory has a mishit, the central processing unit CPU needs to take in data by accessing the external memory. Therefore, the central processing unit needs the function of transmitting an address signal at the first bus to the second bus. When the first and second buses are separated from each other as described above, a problem arises in that the direct memory access controller DMAC will rewrite or renew the contents of the data memory CDM in the cache memory arbitrarily.

In the present embodiment, a break controller UBC is utilized to solve problems, such as the above-described mishit at the cache memory, and the destruction of data stored in the cache memory. The break controller UBC is originally used for program debugging or the like. However, the break controller UBC makes use of the need for connections to the first and second buses and is provided with a transceiver circuit to thereby transmit the address signal at the first bus to the address bus AB2 of the second bus so that the external memory accessed. Further, the break controller UBC monitors an address signal at the second bus and allows the direct memory access controller DMAC to monitor the updating or renewal of the data memory CDM.

The third bus comprises an address bus AB3 and a data bus DB3. Although the invention is not restricted to the particular example, a free running timer FRT, a serial communication interface SCI, a watchdog timer WDT and an operation mode controller MC are electrically connected to the third bus.

The third bus is delayed in its bus cycle as compared with the first and second buses. Namely, those devices mounted to the already-existing single chip microcomputer activated at about 10 MHz are substantially used as they are as respective peripheral modules for these buses by paying attention to the fact that they are not improved in substantial performance and function even if their operating speeds are made faster. In doing so, the efficiency of design can be improved and less power consumption can be achieved by reducing the operating frequency.

An outline of the interrupt controller INTC is as follows: With respect to external interruption, the interrupt controller INTC has five external interruption terminals composed of an NMI and /IRL0 through /IRL3 to be described later. Fifteen external interrupt levels at the /IRL0 through /IRL3 terminals can be set. In the present specification and the partial drawings, /(slash) affixed to each of the alphabetical symbols indicates a bar signal in which a low level is an active level. Incidentally, the bar signals are marked with lines or bars an alphabetical signal or an terminal names according to the conventional method of describing drawings.

As internal interrupt factors, 11 factors may be mentioned which comprise two factors brought from the direct memory access controller DMAC, one factor brought from the divider unit DIVU, three factors brought from the free running timer FRT, one factor brought from the watchdog timer WDT and four factors brought from the serial communication interface SCI. Vector numbers can be set for each of the internal interrupt factors.

Owing to the adoption of the above-described bus dividing method, the respective buses can be shortened in length or the devices connected to them can be reduced in number. Therefore, the load capacity of each bus can be greatly reduced and data processing can be performed at high speed under less power consumption in cooperation with the speeding up of the central processing unit CPU. When the user break controller is provided with the direct memory access controller DMAC, no impairment of reliability is produced because there is provided the function for detecting the incorrect renewal of cache data by the direct memory access controller DMAC due to the above separation of the buses.

As in the case of the central processing unit CPU, the cache memory and the direct memory access controller DMAC, those whose performance and functions are immediately affected by their bus cycles, are connected to the buses having the high-speed bus cycle. As in the case of the free running timer FRT, the serial communication interface SCI or the watchdog timer WDT, of such a type that its bus cycle does not influence data processing directly, is connected to the third bus having the low-speed bus cycle. It is thus unnecessary to develop and design high-speed type peripheral modules compatible with the speeding up of the central processing unit CPU. Further, the already-existing peripheral modules can be used as they are. Therefore, the efficiency of their design can be achieved and less power consumption can be provided because the operating clock signal employed in the modules can be lowered.

A bus state controller BSC is provided to perform the transfer of data to and from the central processing unit CPU or the like in synchronous form. When a signal (data signal) is transferred from the third bus to the second bus, the bus state controller BSC transmits it thereto as it is. Since the pulse generator CPG represented by the synchronous pulse generator shown in FIG. 15 generates a system clock signal for determining first and second bus cycles and a clock pulse employed in a third bus cycle synchronized with it, the signal at the third bus can be transmitted to the second bus as it is. When the signal at the second bus is transmitted to the third bus, the bus state controller BSC performs the operation of transmitting the signal in conformance with a third clock pulse so as not to lose data.

Since the external clock signal supplied from the external terminal can be synchronized with the internal clock signal or it can be set to the frequency obtained by multiplying it, the clock pulse generator CPG employed in the present embodiment is effective in sharing a clock signal between the clock pulse generator CPG and the television video signal processing system and activating a plurality of single chip microcomputers in synchronization with each other.

Operations and effects obtained from the above-described embodiments are as follows:

(1) A clock signal brought from an external terminal through an input buffer is delayed by delay circuits. A counter circuit is started up in accordance with the clock signal transmitted through the delay circuits to count an oscillation pulse set sufficiently high with respect to the clock signal. Further, the counter circuit reversely counts in response to a clock signal delayed by one cycle, which has passed through the input buffer. When the count is returned to at the start of counting, the counter circuit generates an output timing signal and transmits it to an internal circuit through a clock driver. Further, a delay time of the delay circuits is set to a delay time corresponding to the sum of a delay time of the input buffer and a delay time of the clock driver. As a result, an advantageous effect can be brought about in that an internal clock signal capable of being placed in synchronization over a wide range a high frequency to a relatively low frequency can be formed without an increase in circuit scale.

(2) The counter circuit is set as an up/down counter circuit, which performs an up counting operation in synchronism with the leading edge of the clock signal transmitted through the delay circuits and performs a down counting operation in synchronism with the leading edge of the clock signal delayed by one cycle, which has been transmitted through the input buffer. When the count results in zero, the counter circuit stops counting and sets a flip-flop circuit provided at an output portion to thereby produce an output timing signal. The flip-flop circuit is reset in response to the leading edge of the clock signal transmitted through the delay circuits and starts the up counting. As a result, an advantageous effect can be brought about in that an internal clock signal is capable of being placed in synchronization over a wide range from a high frequency to a relatively low frequency under a reduction in circuit scale.

(3) The counter circuit is made up of an up counter that starts counting in synchronism with the leading edge of the clock signal transmitted through the delay circuits, a down counter that receives a count output from the up counter in synchronism with the leading edge of the clock signal delayed by one cycle, which has passed through the input buffer, and a zero detection circuit for detecting that the count of the down counter has reached zero. A flip-flop circuit is set by an output detected by the zero detection circuit and is reset by the clock signal transmitted through the input buffer to thereby form the output timing signal. As a result, an advantageous effect can be brought about in that an internal clock signal is capable of being placed in synchronization over a wide range inclusive of a variation in operating frequency.

(4) The delay circuits are made up of a series circuit including a first delay circuit for forming or producing the delay time corresponding to the input buffer and a second delay circuit for forming the delay time corresponding to the clock driver. As a result, an advantageous effect can be brought about in that the delay time can be produced with satisfactory accuracy through the use of logic circuits or the like which are substantially identical in the number of stages to their circuits.

(5) The pulse generator is made up of a first ring oscillator having a plurality of up-counting stages, and a second ring oscillator having a plurality of down-counting stages in a manner similar to the first ring oscillator and wherein outputs of the respective stages are transferred in synchronism with the leading edge of the clock signal delayed by one cycle, which has passed through the input buffer. As a result, an advantageous effect can be obtained in that high-accuracy synchronization capable of transferring even fractions at the ring oscillators can be implemented.

(6) An overflow detecting circuit is provided in the counter circuit and each the signal switching circuits is provided which transmits the clock signal captured through the input buffer as the internal clock signal as it is when countover is detected by the overflow detecting circuit. As a result, an advantageous effect can be brought about in that the operating range on the low-frequency side can be substantially enlarged and a decrease in the number of stages in the counter circuit permits a reduction in circuit scale.

(7) The frequency of the down counter is set high by N times that of the up counter. The down counter receives a count of the up counter via a register in response to the clock signal delayed by one cycle, which has been transmitted through the input buffer. Further, the down counter counts the oscillation pulses and receives the count of the register each time the pulse count reaches zero, after the elapse of a delay time corresponding to 1/N of the delay circuits. Each time counting operations corresponding to N times reach zero, this processing is repeated by the down counter. As a result, an advantageous effect can be brought about in that an internal clock signal multiplied N times can be formed.

(8) An advantageous effect can be brought about in that a clock generator which is quick in response and is activated stably can be obtained by using the synchronous pulse generator in a microcomputer in which each internal circuit is activated in accordance with a clock signal supplied from an external terminal and a clock signal whose frequency is N times that of the clock signal.

The invention made by the present inventors has been described specifically by reference to various embodiments as described above. However, the present invention is not necessarily limited to the embodiments. It is needless to say that various changes can be made within a scope not departing from their gists or substances. For example, with respect to the delay circuits DL1 and DL2, the delay time td1+td2 may be formed or produced by two delay circuits. With respect to synchronization of the input pulse and the internal pulse with each other, the falling edges thereof may be synchronized with each other. The synchronous pulse generator according to the present invention can be widely used in various semiconductor integrated circuit devices, such as the above single chip microcomputer, etc., that needs an internal clock signal synchronized with the externally-inputted clock signal, as well as to a synchronous DRAM.

An advantageous effect obtained by a typical one of the features disclosed in the present application will be described in brief as follows: A clock signal received from an external terminal through an input buffer is delayed by delay circuits. A counter circuit is started up in accordance with the clock signal transmitted through the delay circuits to count an oscillation pulse set sufficiently high with respect to the clock signal. Further, the counter circuit reversely counts in response to a clock signal delayed by one cycle, which has passed through the input buffer. When the count is returned to the one at the start of counting, the counter circuit generates an output timing signal and transmits it to an internal circuit through a clock driver. Further, the delay time of the delay circuits is set to a delay time corresponding to the sum of a delay time of the input buffer and a delay time of the clock driver. As a result, an internal clock signal capable of being placed in synchronization over a wide range of a high frequency to a relatively low frequency can be formed without an increase in circuit scale.

What is claimed is:

1. A semiconductor integrated circuit device comprising:
   an input buffer which receives a clock signal inputted from an external terminal;
   a delay circuit which delays said clock signal outputted from said input buffer;
   a pulse generator which generates an oscillation pulse higher in frequency than the clock signal;

a timing generator which starts the counting of the oscillation pulse in synchronism with the clock signal outputted from said delay circuit, reverses the counting of the oscillation pulse in response to said clock signal delayed by one cycle from the clock signal outputted from said input buffer, and generates an output timing signal when the resultant count is returned to the one at the start of counting; and an output circuit which outputs an internal clock signal required to activate an internal circuit in response to the output timing signal.

2. A semiconductor integrated circuit device according to claim 1, wherein said timing generator has an up/down counter and a flip-flop circuit and starts up counting in synchronism with the leading edge of the clock signal outputted from said delay circuit, starts down counting in synchronism with the leading edge of the clock signal delayed by one cycle from the clock signal outputted from said input buffer, sets the flip-flop circuit when a count has reached zero to thereby form an output timing signal, and resets the flip-flop circuit in synchronism with the leading edge of the clock signal outputted from said input buffer circuit.

3. A semiconductor integrated circuit device according to claim 1, wherein said timing generator has an up counter which starts counting in synchronism with the leading edge of the clock signal outputted from said delay circuit, a down counter which receives a count output produced from said up counter in synchronism with the leading edge of the clock signal delayed by one cycle from the clock signal outputted from said input buffer to thereby perform a down counting operation, and a zero detection circuit which detects that a count of said down counter has reached zero, whereby said flip-flop circuit is set based on an output detected by said zero detection circuit and is reset based on the clock signal outputted from said input buffer to thereby form the output timing signal.

4. A semiconductor integrated circuit device according to claim 1, 2 or 3, wherein said delay circuit has a series circuit comprising a first delay circuit which produces a delay time corresponding to said input buffer, and a second delay circuit which produces a delay time corresponding to said output circuit.

5. A semiconductor integrated circuit device according to claim 3, wherein said pulse generator has an up-counting first ring oscillator and a down-counting second ring oscillator, and wherein signal levels at respective stages in said second ring oscillator are respectively transmitted to respective stages in said first ring oscillator in synchronism with the leading edge of the clock signal delayed by one cycle from the clock signal outputted from said input buffer.

6. A semiconductor integrated circuit device according to claim 5, wherein said first ring oscillator comprises:

a first series circuit having unit circuits provided in even-numbered stages, which comprise first NAND gates having two inputs and inverters for reversing signals outputted from said first NAND gates and for transmitting the reversed signals to one inputs of the next-stage circuits, and second NAND gates having one input to which signals outputted from said first series circuit are fed back and another input supplied with an operation control signal, said second NAND gates transmitting signals outputted therefrom to first inputs of said first NAND gates corresponding to the initial-stage unit circuits of the first series circuit, said second ring oscillator comprises, a second series circuit having unit circuits provided in the same even-numbered stages as said first ring oscillator, and which comprise third NAND gates having two inputs and inverters for reversing signals outputted from said third NAND gates and for transmitting the reversed signals to one inputs of the next-stage circuits, and fourth NAND gates having one input to which signals outputted from said second series circuit are fed back and another input supplied with an operation control signal, said fourth NAND gates transmitting signals outputted therefrom to first inputs of said third NAND gates corresponding to the initial-stage unit circuits of said second series circuit, said respective unit circuits constituting said first ring oscillator and said respective unit circuits constituting said second ring oscillator having opposite signal transfer directions and the output of the unit circuit corresponding to the first stage in said first ring oscillator corresponds to the unit circuit corresponding to the last stage in said second ring oscillator, and further including fifth NAND gates which receive outputs produced from the unit circuits corresponding to the respective stages in said first ring oscillator and a set signal generated in synchronism with the leading edge of the clock signal delayed by one cycle, which has passed through said input buffer, and which transmits signals outputted therefrom to the other inputs of first NAND gates in the next-stage circuits and the other inputs of the third NAND gates in the unit circuits of said corresponding second ring oscillator.

7. A semiconductor integrated circuit device according to claim 6, wherein dummy circuits corresponding to the fifth NAND gates are provided at outputs of the respective unit circuits constituting said second ring oscillator.

8. A semiconductor integrated circuit device according to any of claims 1 to 3 and 5 to 7, wherein said timing generator is provided with an overflow detecting circuit and signal switching circuits each of which transmits the clock signal captured through said input buffer as the internal clock signal as it is when countover is detected by said overflow detecting circuit.

9. A semiconductor integrated circuit device according to any of claims 1 to 3 and 5 to 7, which constitutes a synchronous dynamic RAM and wherein said internal clock signal is used as a signal for activating a data output buffer.

10. A semiconductor integrated circuit device comprising:

an input buffer which receives a clock signal inputted from an external terminal;

a delay circuit which delays the clock signal received by said input buffer;

a pulse generator which produces an oscillation pulse higher in frequency than the clock signal frequency;

an up counter started in response to a clock signal outputted from said delay circuit and for counting a pulse obtained by dividing the oscillation pulse by N (where N is an integer);

a down counter which receives a count of the up counter via a register in response to a clock signal delayed by one cycle from said input buffer, counts the oscillation pulse, receiving therein a count of the register each time the count of the pulse reaches zero, after the elapse of a delay time corresponding to 1/N of said delay circuit, and repeats the counting operations N times; and a circuit which generates an internal pulse in synchronism with a zero output indicative of a count of said down counter.

11. A semiconductor integrated circuit device according to claim 10, wherein the delay time of said delay circuit is set to a delay time corresponding to N times the sum of a delay time of said input buffer and a delay time of said output circuit.

12. A semiconductor integrated circuit device according to claim 10 or 11, which has a microcomputer function of a plurality of activating each of internal circuits in response to a clock signal supplied from an external terminal and a clock signal having a frequency corresponding to N times that of said clock signal.

13. A semiconductor integrated circuit device comprising:

an input buffer which receives a clock signal through an external terminal;

a delay circuit which produces a clock signal obtained by delaying the clock signal supplied through said input buffer;

a pulse generator which generates an oscillation pulse having a frequency higher than that of the clock signal;

a counter circuit which starts counting of the pulse in synchronism with the clock signal outputted from said delay circuit, switches a direction of said counting to its opposite direction in response to a clock signal which has passed through said input buffer, and produces an output timing signal when a resultant count again reaches the count at the start of counting;

a status retention circuit which receives the output timing signal produced from said counter circuit and holds the output timing signal therein; and a clock driver which supplies an internal clock signal in response to the output timing signal held in said status retention circuit; and wherein a delay time of said delay circuit is a delay equivalent to the sum of a delay time of said input buffer and a delay time of said clock driver.

14. A semiconductor integrated circuit device according to claim 13, wherein said counter circuit is an upward or downward counter circuit.

15. A semiconductor integrated circuit device according to claim 14, wherein said status retention circuit is reset in response to the leading edge of the clock signal transmitted through said input buffer.

16. A semiconductor integrated circuit device according to claim 15, wherein said delay circuit comprises a series circuit having a first delay circuit which produces a delay time corresponding to said input buffer and a second delay circuit for producing a delay time corresponding to said clock driver.

* * * * *